United States Patent
Poudel et al.

(10) Patent No.: US 11,513,153 B2
(45) Date of Patent: Nov. 29, 2022

(54) SYSTEM AND METHOD FOR FACILITATING BUILT-IN SELF-TEST OF SYSTEM-ON-CHIPS

(71) Applicant: NXP USA, Inc., Austin, TX (US)

(72) Inventors: Rohan Poudel, Bhairahawa (NP); Anurag Jindal, Austin, TX (US); Joseph Rollin Wright, Round Rock, TX (US); Nipun Mahajan, Pitampura (IN); Shruti Singla, Samana (IN); Hemant Nautiyal, Greater Noida (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/301,936

(22) Filed: Apr. 19, 2021

(65) Prior Publication Data

US 2022/0334181 A1 Oct. 20, 2022

(51) Int. Cl.
*G01R 31/317* (2006.01)
*G01R 31/3185* (2006.01)
*G01R 31/3193* (2006.01)

(52) U.S. Cl.
CPC ... *G01R 31/31724* (2013.01); *G01R 31/3193* (2013.01); *G01R 31/31701* (2013.01); *G01R 31/318566* (2013.01)

(58) Field of Classification Search
None
See application file for complete search history.

(56) References Cited

U.S. PATENT DOCUMENTS

| | | |
|---|---|---|
| 6,728,916 B2 | 4/2004 | Chen et al. |
| 8,386,864 B2 | 2/2013 | Dubey et al. |
| 8,639,994 B2 | 1/2014 | Chen et al. |
| 9,024,650 B2 | 5/2015 | Somachudan et al. |
| 9,436,567 B2 | 9/2016 | Gorti et al. |
| 2002/0138801 A1* | 9/2002 | Wang ............... G01R 31/31705 714/729 |
| 2012/0137185 A1 | 5/2012 | Venkataramanan et al. |
| 2013/0328583 A1* | 12/2013 | Wada ............ G01R 31/318555 324/750.3 |
| 2018/0313894 A1* | 11/2018 | Suzuki ................ G11C 29/32 |
| 2020/0075116 A1* | 3/2020 | Kalva ............ G01R 31/318555 |

* cited by examiner

*Primary Examiner* — Guerrier Merant

(57) ABSTRACT

A control system, that includes a primary controller and various auxiliary controllers, is configured to facilitate a built-in self-test (BIST) of a system-on-chip (SoC). The primary controller is configured to initiate a BIST sequence associated with the SoC. Based on the BIST sequence initiation, each auxiliary controller is configured to schedule execution of various self-test operations on various functional circuits, various memories, and various logic circuits of the SoC by various functional BIST controllers, various memory BIST controllers, and various logic BIST controllers of the SoC, respectively. Based on the execution of the self-test operations, each auxiliary controller further generates various status bits with each status bit indicating whether at least one functional circuit, at least one memory, or at least one logic circuit is faulty. Based on the status bits generated by each auxiliary controller, a fault diagnosis of the SoC is initiated.

19 Claims, 7 Drawing Sheets

SYSTEM AND METHOD FOR FACILITATING BUILT-IN SELF-TEST OF SYSTEM-ON-CHIPS

BACKGROUND

The present disclosure relates generally to electronic circuits, and, more particularly, to a system and a method for facilitating a built-in self-test (BIST) of system-on-chips (SoCs).

An SoC typically includes various BIST controllers to execute self-test operations of the SoC, and a control system to control operations of the BIST controllers. The control system includes a primary controller and various auxiliary controllers coupled between the primary controller and the BIST controllers. The primary controller controls operations of the auxiliary controllers. Further, each auxiliary controller controls operations of BIST controllers coupled therewith. For example, to execute a BIST of the SoC, the primary controller enables one or more auxiliary controllers, and each auxiliary controller enables the corresponding BIST controllers coupled therewith. The BIST controllers may then execute various self-test operations on associated circuits-under-test and generate a set of result bits to initiate a fault diagnosis of the SoC.

Typically, the control system is capable of controlling exclusively a single type of BIST controller (e.g., a memory BIST controller). The SoC, however, includes various other types of BIST controllers (e.g., functional BIST controllers and logic BIST controllers). This limits a degree of the BIST facilitated by the control system. The control system is further required to configure the BIST controllers for executing corresponding self-test operations, thereby leading to a significant programming overhead on the control system. Further, the primary controller is coupled with the auxiliary controllers in a synchronous manner (i.e., by way of a synchronous interface). Such a synchronous coupling results in a significant increase in a design complexity of the control system. The design complexity of the control system further increases with the scalability of the SoC. Therefore, there exists a need for a technical solution that solves the aforementioned problems of existing control systems that facilitate a BIST of SoCs.

SUMMARY

In an embodiment of the present disclosure, a control system for facilitating a built-in self-test (BIST) of a system-on-chip (SoC) is disclosed. The control system can include a primary controller configured to initiate a BIST sequence associated with the SoC and a plurality of auxiliary controllers coupled with the primary controller. A first auxiliary controller can be configured to sequentially schedule, based on the initiation of the BIST sequence, execution of first through third sets of self-test operations on first through third test circuits of the SoC by a set of functional BIST controllers, a set of memory BIST (MBIST) controllers, and a set of logic BIST (LBIST) controllers, respectively. The first auxiliary controller can be further configured to provide, to the primary controller based on the execution of the first through third sets of self-test operations, first through third status bits that indicate whether at least one functional circuit of the first test circuit, at least one memory of the second test circuit, and at least one logic circuit of the third test circuit are faulty, respectively.

In another embodiment of the present disclosure, a system-on-chip (SoC) is disclosed. The SoC can include first through third test circuits. The SoC can further include a set of functional built-in self-test (BIST) controllers, a set of memory BIST (MBIST) controllers, and a set of logic BIST (LBIST) controllers that can be coupled with the first through third test circuits, and configured to execute first through third sets of self-test operations on the first through third test circuits, respectively. The SoC can further include a control system configured to facilitate a BIST of the SoC. The control system can include a primary controller configured to initiate a BIST sequence associated with the SoC, and a plurality of auxiliary controllers coupled with the primary controller. A first auxiliary controller of the plurality of auxiliary controllers can be further coupled with the set of functional BIST controllers, the set of MBIST controllers, and the set of LBIST controllers. The first auxiliary controller can be configured to sequentially schedule, based on the initiation of the BIST sequence, execution of the first through third sets of self-test operations by the set of functional BIST controllers, the set of MBIST controllers, and the set of LBIST controllers, respectively. The first auxiliary controller can be further configured to provide, to the primary controller based on the execution of the first through third sets of self-test operations, first through third status bits that indicate whether at least one functional circuit of the first test circuit, at least one memory of the second test circuit, and at least one logic circuit of the third test circuit are faulty, respectively.

In yet another embodiment, a method for facilitating a built-in self-test (BIST) of a system-on-chip (SoC) by a control system of the SoC is disclosed. The method can include initiating a BIST sequence associated with the SoC by a primary controller of the control system. The method can further include sequentially scheduling, by a first auxiliary controller of a plurality of auxiliary controllers of the control system based on the initiation of the BIST sequence, execution of first through third sets of self-test operations on first through third test circuits of the SoC by a set of functional BIST controllers, a set of memory BIST controllers, and a set of logic BIST controllers of the SoC, respectively. Further, the method can include providing, based on the execution of the first through third sets of self-test operations, first through third status bits to the primary controller, respectively, by the first auxiliary controller. The first through third status bits can indicate whether at least one functional circuit of the first test circuit, at least one memory of the second test circuit, and at least one logic circuit of the third test circuit are faulty, respectively.

In some embodiments, to initiate the BIST sequence, the primary controller can be further configured to generate first through third control signals associated with the first through third sets of self-test operations, respectively.

In some embodiments, the primary controller can be further configured to provide the first control signal to the first auxiliary controller. The first auxiliary controller can schedule the execution of the first set of self-test operations when the first control signal is activated. The first auxiliary controller can be further configured to generate and provide, to the primary controller as a response to the first control signal, a first acknowledgment signal such that the first acknowledgment signal is activated when the first set of self-test operations is executed.

In some embodiments, the first auxiliary controller can schedule the execution of the first set of self-test operations in one of a serial manner, a parallel manner, and a staggered manner. To schedule the execution of the first set of self-test operations, the first auxiliary controller can be further configured to generate and provide a first set of trigger signals to the set of functional BIST controllers such that each self-test operation of the first set of self-test operations is executed when a corresponding trigger signal of the first set of trigger signals is activated.

In some embodiments, the first test circuit includes a set of functional circuits. The first auxiliary controller can be further configured to receive, from the set of functional BIST controllers, a first set of result bits associated with the first set of self-test operations such that each result bit of the first set of result bits indicates whether a corresponding functional circuit of the set of functional circuits is faulty. The first auxiliary controller can be further configured to generate the first status bit based on the first set of result bits.

In some embodiments, the primary controller can be further configured to provide, based on the first acknowledgment signal, the second control signal to the first auxiliary controller. The first auxiliary controller can schedule the execution of the second set of self-test operations when the second control signal is activated. The first auxiliary controller can be further configured to generate and provide, to the primary controller as a response to the second control signal, a second acknowledgment signal such that the second acknowledgment signal is activated when the second set of self-test operations is executed.

In some embodiments, the first auxiliary controller can schedule the execution of the second set of self-test operations in one of a serial manner, a parallel manner, and a staggered manner. To schedule the execution of the second set of self-test operations, the first auxiliary controller can be further configured to generate and provide a second set of trigger signals to the set of MBIST controllers such that each self-test operation of the second set of self-test operations is executed when a corresponding trigger signal of the second set of trigger signals is activated.

In some embodiments, the first auxiliary controller can be further configured to receive, from the set of MBIST controllers, a second set of result bits associated with the second set of self-test operations such that each result bit of the second set of result bits indicates whether a corresponding memory of the set of memories is faulty. The first auxiliary controller can be further configured to generate the second status bit based on the second set of result bits.

In some embodiments, the primary controller can be further configured to provide, based on the second acknowledgment signal, the third control signal to the first auxiliary controller. The first auxiliary controller can schedule the execution of the third set of self-test operations when the third control signal is activated. The first auxiliary controller can be further configured to generate and provide, to the primary controller as a response to the third control signal, a third acknowledgment signal such that the third acknowledgment signal is activated when the third set of self-test operations is executed.

In some embodiments, the first auxiliary controller can schedule the execution of the third set of self-test operations in one of a serial manner, a parallel manner, and a staggered manner. To schedule the execution of the third set of self-test operations, the first auxiliary controller can be further configured to generate and provide a third set of trigger signals to the set of LBIST controllers such that each self-test operation of the third set of self-test operations is executed when a corresponding trigger signal of the third set of trigger signals is activated.

In some embodiments, the third test circuit includes a set of logic circuits. The first auxiliary controller can be further configured to receive, from the set of LBIST controllers, a third set of result bits associated with the third set of self-test operations such that each result bit of the third set of result bits indicates whether a corresponding logic circuit of the set of logic circuits is faulty. The first auxiliary controller can be further configured to generate the third status bit based on the third set of result bits.

In some embodiments, the primary controller can be further configured to generate, to initiate the BIST sequence, fourth through sixth control signals associated with fourth through sixth sets of self-test operations that are to be executed on fourth through sixth test circuits, respectively. A second auxiliary controller of the plurality of auxiliary controllers can be configured to sequentially schedule the execution of the fourth through sixth sets of self-test operations. Further, the primary controller can be configured to provide the first and fourth control signals to the first and second auxiliary controllers to facilitate the execution of the first and fourth sets of self-test operations, respectively. The primary controller can provide the first and fourth control signals to the first and second auxiliary controllers, respectively, in one of a serial manner, a parallel manner, and a staggered manner. Further, the primary controller can be further configured to provide the second and fifth control signals to the first and second auxiliary controllers to facilitate the execution of the second and fifth sets of self-test operations, respectively, when the first and fourth sets of self-test operations are executed. The primary controller can provide the second and fifth control signals to the first and second auxiliary controllers, respectively, in one of a serial manner, a parallel manner, and a staggered manner. Further, the primary controller can be configured to provide the third and sixth control signals to the first and second auxiliary controllers to facilitate the execution of the third and sixth sets of self-test operations, respectively, when the second and fifth sets of self-test operations are executed. The primary controller can provide the third and sixth control signals to the first and second auxiliary controllers, respectively, in one of a serial manner, a parallel manner, and a staggered manner.

In some embodiments, the primary controller can be further coupled with a fault controller of the SoC. The primary controller can be further configured to generate a fault signal based on the first through third status bits, and provide the fault signal to the fault controller to facilitate a fault diagnosis of the SoC.

In some embodiments, the primary controller can be further configured to generate, to initiate the BIST sequence, seventh and eighth control signals, and provide the seventh and eighth control signals to the first auxiliary controller before the execution of the second set of self-test operations is scheduled, and after the third set of self-test operations is executed, respectively. The first auxiliary controller can be further configured to generate a set of isolation signals and a set of select signals such that the set of isolation signals and the set of select signals are activated when the seventh control signal is activated and deactivated when the eighth control signal is activated. The set of isolation signals and the set of select signals can be activated to activate a self-test mode of the SoC, and deactivated to deactivate the self-test mode of the SoC. The execution of the second and third sets of self-test operations can be scheduled during the self-test mode of the SoC.

In some embodiments, the primary controller and the first auxiliary controller can be further coupled with a core circuit of the SoC, and further configured to receive first and second configuration data, respectively. The primary controller can initiate the BIST sequence based on the first configuration data, and the first auxiliary controller can schedule the execution of the first through third sets of self-test operations based on the second configuration data.

Various embodiments of the present disclosure disclose a control system that can facilitate a built-in self-test (BIST) of a system-on-chip (SoC). The control system can include a primary controller configured to initiate a BIST sequence associated with the SoC and various auxiliary controllers coupled with the primary controller. Each auxiliary controller can be further coupled with various functional BIST controllers, various memory BIST (MBIST) controllers, and various logic BIST (LBIST) controllers of the SoC. Each auxiliary controller can be configured to schedule, based on the initiation of the BIST sequence, execution of self-test operations on various functional circuits, various memories, and various logic circuits of the SoC by the functional BIST controllers, the MBIST controllers, and the LBIST controllers, respectively. The execution of the self-test operations on the functional circuits can be scheduled before the execution of the self-test operations on the memories and the logic circuits. Further, the execution of the self-test operations on the memories can be scheduled before the execution of the self-test operations on the logic circuits. Each auxiliary controller can be further configured to generate and provide various status bits to the primary controller based on the execution of the self-test operations on the functional circuits, the memories, and the logic circuits. Each status bit can indicate whether at least one functional circuit, at least one memory, or at least one logic circuit is faulty.

Thus, the control system of the present disclosure can control various types of BIST controllers (e.g., the functional BIST controllers, the MBIST controllers, and the LBIST controllers). Hence, a degree of the BIST facilitated by the control system of the present disclosure is significantly greater than that facilitated by a conventional control system that is capable of controlling exclusively one type of BIST controllers. Further, various components of the SoC (such as the functional BIST controllers, the MBIST controllers, and the LBIST controllers) are configured to execute corresponding self-test operations by a core circuit of the SoC. As a result, a programming overhead on the control system of the present disclosure is significantly less than that on the conventional control system where the control system is required to configure associated BIST controllers. Further, the primary controller is coupled with the auxiliary controllers in an asynchronous manner (i.e., by way of an asynchronous interface). As a result, a design complexity of the control system of the present disclosure is significantly less than that of the conventional control system where a primary controller is synchronously coupled with various auxiliary controllers. The asynchronous coupling between the primary controller and the auxiliary controllers further ensures that the design complexity of the control system remains unaffected by an increase in a number of auxiliary controllers in the SoC. Hence, the scalability of the SoC including the control system of the present disclosure is less complex than that of an SoC including the conventional control system. Thus, the control system of the present disclosure facilitates the BIST of the SoC in a more efficient manner as compared to conventional control systems.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1A:
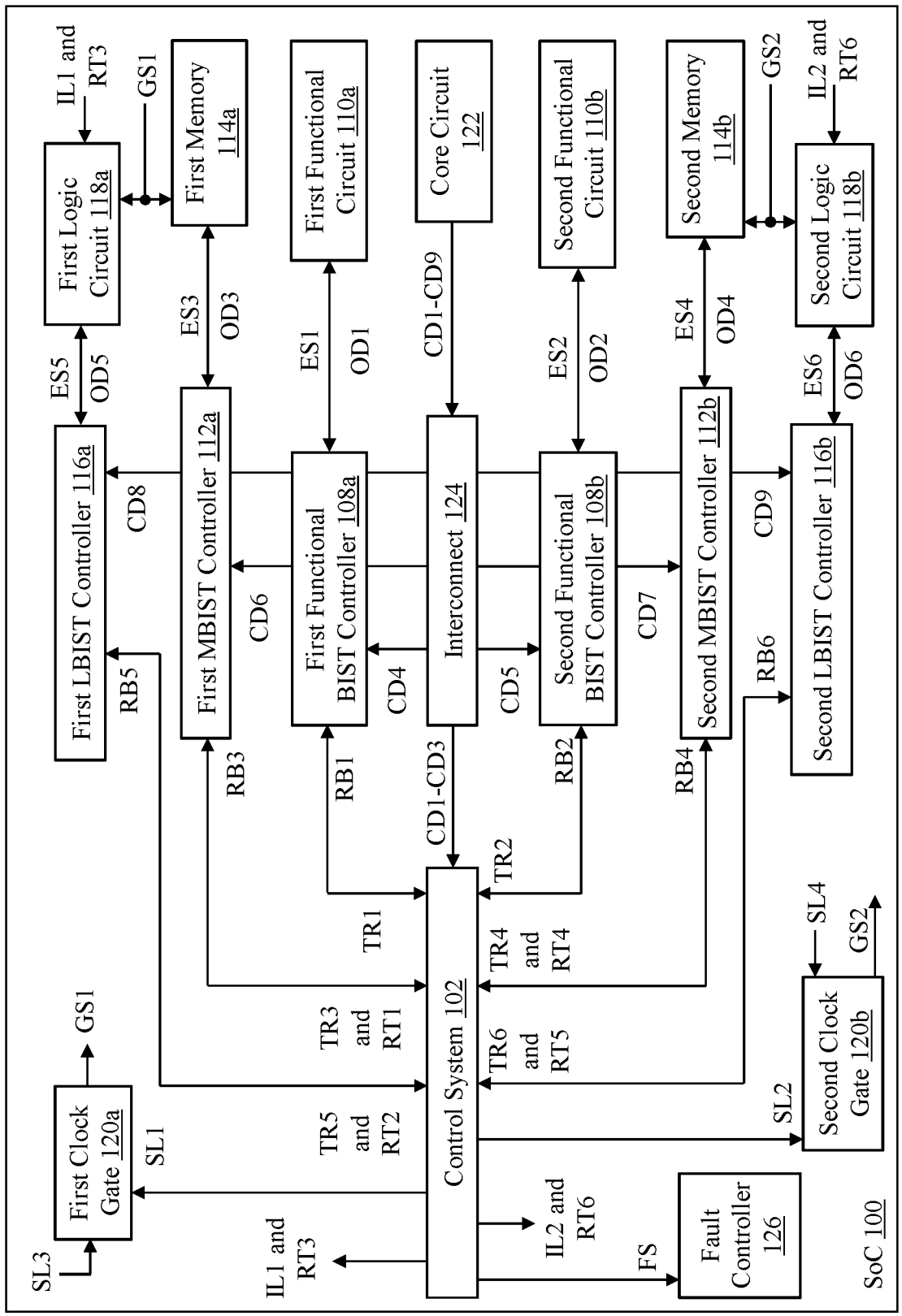
FIG. 1A illustrates a schematic block diagram of a system-on-chip (SoC) in accordance with an embodiment of the present disclosure.
Figure 1B:
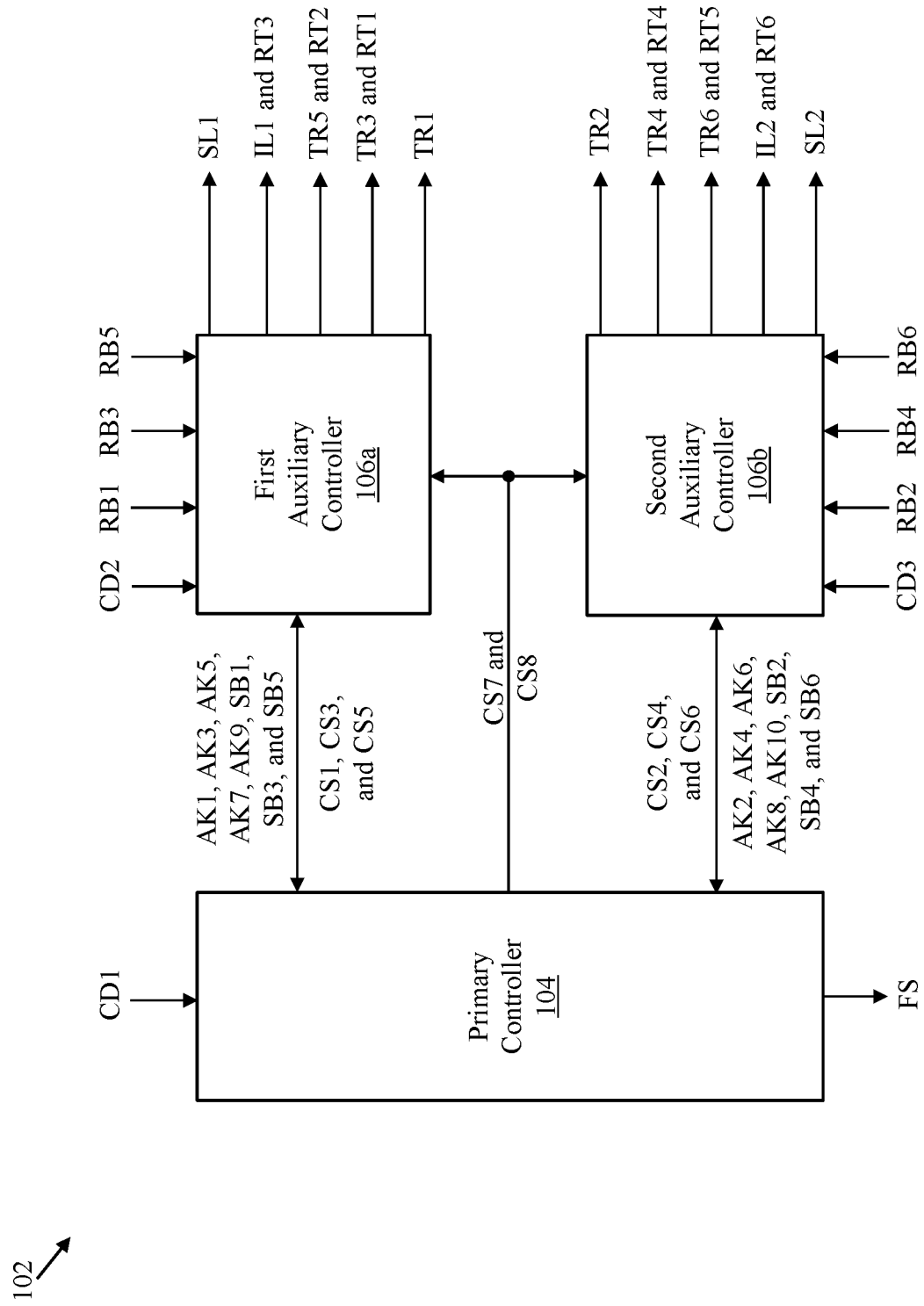
FIG. 1B illustrates a schematic block diagram of a control system of the SoC of FIG. 1 in accordance with an embodiment of the present disclosure.

FIG. 1A illustrates a schematic block diagram of a system-on-chip (SoC) 100 in accordance with an embodiment of the present disclosure. The SoC 100 can include a control system 102. FIG. 1B illustrates a schematic block diagram of the control system 102 in accordance with an embodiment of the present disclosure. FIG. 1A has been explained in conjunction with FIG. 1B. The control system 102 can include a primary controller 104 and a plurality of auxiliary controllers of which first and second auxiliary controllers 106a and 106b are shown. The primary controller 104 is asynchronously coupled with the first and second auxiliary controllers 106a and 106b. In other words, an interface between the primary controller 104 and the first and second auxiliary controllers 106a and 106b is asynchronous.

The SoC 100 can further include a first set of functional built-in self-test (BIST) controllers of which a first functional BIST controller 108a is shown, and a first test circuit that can include a first set of functional circuits of which a first functional circuit 110a is shown. The first set of functional BIST controllers can be coupled with the first set of functional circuits such that the first functional BIST controller 108a is coupled with the first functional circuit 110a. The SoC 100 can further include a first set of memory BIST (MBIST) controllers of which a first MBIST controller 112a is shown, and a second test circuit that can include a first set of memories of which a first memory 114a is shown. The first set of MBIST controllers can be coupled with the first set of memories such that the first MBIST controller 112a is coupled with the first memory 114a. Further, the SoC 100 can include a first set of logic BIST (LBIST) controllers of which a first LBIST controller 116a is shown, and a third test circuit that can include a first set of logic circuits of which a first logic circuit 118a is shown. The first set of LBIST controllers can be coupled with the first set of logic circuits such that the first LBIST controller 116a is coupled with the first logic circuit 118a. The first set of functional BIST controllers, the first set of MBIST controllers, and the first set of LBIST controllers can be further coupled with the first auxiliary controller 106a.

The SoC 100 can further include a second set of functional BIST controllers of which a second functional BIST controller 108b is shown, and a fourth test circuit that can include a second set of functional circuits of which a second functional circuit 110b is shown. The second set of functional BIST controllers can be coupled with the second set of functional circuits such that the second functional BIST controller 108b is coupled with the second functional circuit 110b. The SoC 100 can further include a second set of MBIST controllers of which a second MBIST controller 112b is shown, and a fifth test circuit that can include a second set of memories of which a second memory 114b is shown. The second set of MBIST controllers is coupled with the second set of memories such that the second MBIST controller 112b is coupled with the second memory 114b. Further, the SoC 100 can include a second set of LBIST controllers of which a second LBIST controller 116b is shown, and a sixth test circuit that can include a second set of logic circuits of which a second logic circuit 118b is shown. The second set of LBIST controllers can be coupled with the second set of logic circuits such that the second LBIST controller 116b is coupled with the second logic circuit 118b. The second set of functional BIST controllers, the second set of MBIST controllers, and the second set of LBIST controllers can be further coupled with the second auxiliary controller 106b. The SoC 100 can further include first and second clock gates 120a and 120b, a core circuit 122, an interconnect 124, and a fault controller 126.

The control system 102 can be coupled with the first and second functional BIST controllers 108a and 108b, the first and second MBIST controllers 112a and 112b, and the first and second LBIST controllers 116a and 116b, and configured to facilitate a BIST of the SoC 100. The control system 102 can include the primary controller 104 and the first and second auxiliary controllers 106a and 106b that are coupled with the primary controller 104.

The primary controller 104 can include suitable logic, circuitry, interfaces, and/or code, executable by the circuitry, that can be configured to perform one or more operations as stated herein. For example, the primary controller 104 can be configured to receive first configuration data CD1. The first configuration data CD1 can indicate which auxiliary controllers of the plurality of auxiliary controllers are to be scheduled (i.e., enabled) for executing corresponding operations. The first configuration data CD1 can further indicate a manner (e.g., serial, parallel, or staggered) in which the auxiliary controllers are to be scheduled. Based on the first configuration data CD1, the primary controller 104 can be further configured to initiate a BIST sequence associated with the SoC 100.

To initiate the BIST sequence, the primary controller 104 can be further configured to generate first through sixth control signals CS1-CS6 associated with first through sixth self-test operations, respectively. The first and second self-test operations can correspond to operations that are to be executed on the first and second functional circuits 110a and 110b by the first and second functional BIST controllers 108a and 108b, respectively. Similarly, the third and fourth self-test operations can correspond to operations that are to be executed on the first and second memories 114a and 114b by the first and second MBIST controllers 112a and 112b, respectively. Further, the fifth and sixth self-test operations can correspond to operations that are to be executed on the first and second logic circuits 118a and 118b by the first and second LBIST controllers 116a and 116b, respectively. In an embodiment, the first through sixth self-test operations are scheduled for execution when the primary controller 104 activates the first through sixth control signals CS1-CS6 (i.e., generates the first through sixth control signals CS1-CS6 at a logic high state), respectively. To initiate the BIST sequence, the primary controller 104 can be further configured to generate seventh and eighth control signals CS7 and CS8 associated with activation and deactivation of a self-test mode of the SoC 100, respectively. In an embodiment, the self-test mode of the SoC 100 is activated when the primary controller 104 activates the seventh control signal CS7 (i.e., generates the seventh control signal CS7 at a logic high state). The self-test mode of the SoC 100 is activated to execute self-test operations on memories (such as the first and second memories 114a and 114b) and logic circuits (such as the first and second logic circuits 118a and 118b) of the SoC 100. Further, the self-test mode of the SoC 100 is deactivated when the primary controller 104 activates the eighth control signal CS8 (i.e., generates the eighth control signal CS8 at a logic high state).

The BIST sequence associated with the SoC 100 can indicate that the self-test operations are to be executed in a predefined order. For example, the BIST sequence can indicate that the self-test operations on memories (such as the first and second memories 114a and 114b) are to be executed after the self-test operations are executed on functional circuits (such as the first and second functional circuits 110a and 110b) and before the self-test operations are executed on logic circuits (such as the first and second logic circuits 118a and 118b). In other words, the third and fourth self-test operations are to be executed after the first and second self-test operations are executed and before the fifth and sixth self-test operations are executed. Thus, the primary controller 104 activates the third and fourth control signals CS3 and CS4 after the first and second control signals CS1 and CS2 are activated and before the fifth and sixth control signals CS5 and CS6 are activated.

The BIST sequence can further indicate that the self-test mode of the SoC 100 is activated after the first and second self-test operations are executed, and deactivated after the third through sixth self-test operations are executed. Thus, the primary controller 104 activates the seventh control signal CS7 after the first and second control signals CS1 and CS2 are activated, and activates the eighth control signal CS8 after the fifth and sixth control signals CS5 and CS6 are activated.

The primary controller 104 can be configured to provide the first, third, and fifth control signals CS1, CS3, and CS5 to the first auxiliary controller 106a to facilitate the execution of the first, third, and fifth self-test operations, respectively. Similarly, the primary controller 104 can be configured to provide the second, fourth, and sixth control signals CS2, CS4, and CS6 to the second auxiliary controller 106b to facilitate the execution of the second, fourth, and sixth self-test operations, respectively. In response to the first through sixth control signals CS1-CS6, the primary controller 104 can be further configured to receive first through sixth acknowledgment signals AK1-AK6, respectively. The first through sixth acknowledgment signals AK1-AK6 can indicate whether the first through sixth self-test operations are executed, respectively. The first, third, and fifth acknowledgment signals AK1, AK3, and AK5 are received from the first auxiliary controller 106a, and the second, fourth, and sixth acknowledgment signals AK2, AK4, and AK6 are received from the second auxiliary controller 106b.

The primary controller 104 can be configured to provide the first and second control signals CS1 and CS2 to the first and second auxiliary controllers 106a and 106b to facilitate the execution of the first and second self-test operations, respectively, upon initiation of the BIST sequence. In an embodiment, prior to providing the first and second control signals CS1 and CS2 to the first and second auxiliary controllers 106a and 106b, respectively, the primary controller 104 and the first and second auxiliary controllers

106*a* and 106*b* may communicate a first set of handshake signals (not shown) to establish asynchronous communication links therebetween. The primary controller 104 can provide the first and second control signals CS1 and CS2 to the first and second auxiliary controllers 106*a* and 106*b*, respectively, in one of a serial manner, a parallel manner, and a staggered manner.

In response to the first and second control signals CS1 and CS2, the primary controller 104 can be further configured to receive the first and second acknowledgment signals AK1 and AK2 from the first and second auxiliary controllers 106*a* and 106*b*, respectively. The first and second acknowledgment signals AK1 and AK2 can indicate whether the first and second self-test operations are executed, respectively. In an embodiment, the first and second acknowledgment signals AK1 and AK2 are activated (i.e., are at a logic high state) when the first and second self-test operations are executed, respectively. Additionally, the primary controller 104 can be configured to receive, in response to the first and second control signals CS1 and CS2, first and second status bits SB1 and SB2 from the first and second auxiliary controllers 106*a* and 106*b*, respectively. The first status bit SB1 can indicate whether at least one functional circuit of the first set of functional circuits (i.e., the first test circuit) is faulty (i.e., whether a fault is detected in at least one functional circuit of the first set of functional circuits). Similarly, the second status bit SB2 indicates whether at least one functional circuit of the second set of functional circuits (i.e., the fourth test circuit) is faulty. In an embodiment, the first and second status bits SB1 and SB2 are activated (i.e., are at a logic high state) when at least one functional circuit of the first set of functional circuits and at least one functional circuit of the second set of functional circuits are faulty, respectively.

When the first and second control signals CS1 and CS2 are to be provided to the first and second auxiliary controllers 106*a* and 106*b*, in a serial manner, the second control signal CS2 can be provided to the second auxiliary controller 106*b* exclusively after the first acknowledgment signal AK1 is received by the primary controller 104. Similarly, when the first and second control signals CS1 and CS2 are to be provided to the first and second auxiliary controllers 106*a* and 106*b*, in a parallel manner, the first and second control signals CS1 and CS2 can be simultaneously provided to the first and second auxiliary controllers 106*a* and 106*b*, respectively. Further, when the first and second control signals CS1 and CS2 are to be provided to the first and second auxiliary controllers 106*a* and 106*b*, in a staggered manner, the second control signal CS2 can be provided to the second auxiliary controller 106*b* after the first control signal CS1 is provided to the first auxiliary controller 106*a* and before the first acknowledgment signal AK1 is received by the primary controller 104.

The primary controller 104 can be further configured to provide, based on the first and second acknowledgment signals AK1 and AK2, the seventh control signal CS7 to the first and second auxiliary controllers 106*a* and 106*b* to facilitate the activation of the self-test mode of the SoC 100. The primary controller 104 can provide the seventh control signal CS7 to the first and second auxiliary controllers 106*a* and 106*b* when the first and second self-test operations are executed (i.e., when the first and second acknowledgment signals AK1 and AK2 are activated), and before the execution of the third and fourth self-test operations is scheduled. In an embodiment, prior to providing the seventh control signal CS7 to the first and second auxiliary controllers 106*a* and 106*b*, the primary controller 104 and the first and second auxiliary controllers 106*a* and 106*b* may communicate a second set of handshake signals (not shown) to establish asynchronous communication links therebetween.

In response to the seventh control signal CS7, the primary controller 104 can be configured to receive seventh and eighth acknowledgment signals AK7 and AK8 from the first and second auxiliary controllers 106*a* and 106*b*, respectively. The seventh and eighth acknowledgment signals AK7 and AK8 can indicate successful activation of the self-test mode by the first and second auxiliary controllers 106*a* and 106*b*. The activation of the self-test mode by the first and second auxiliary controllers 106*a* and 106*b* corresponds to activation of various select and isolation signals by the first and second auxiliary controllers 106*a* and 106*b* to gate clock signals and isolate outputs associated with corresponding partitions (not shown) in the SoC 100. In an embodiment, the seventh and eighth acknowledgment signals AK7 and AK8 are activated (i.e., are at a logic high state) when the self-test mode is activated.

The primary controller 104 can be further configured to provide, based on the seventh and eighth acknowledgment signals AK7 and AK8, the third and fourth control signals CS3 and CS4 to the first and second auxiliary controllers 106*a* and 106*b* to facilitate the execution of the third and fourth self-test operations, respectively. The primary controller 104 can provide the third and fourth control signals CS3 and CS4 to the first and second auxiliary controllers 106*a* and 106*b*, respectively, when the self-test mode of the SoC 100 is activated (i.e., when the seventh and eighth acknowledgment signals AK7 and AK8 are activated). The third and fourth control signals CS3 and CS4 can be provided to the first and second auxiliary controllers 106*a* and 106*b*, respectively, in one of a serial manner, a parallel manner, and a staggered manner. In an embodiment, prior to providing the third and fourth control signals CS3 and CS4 to the first and second auxiliary controllers 106*a* and 106*b*, respectively, the primary controller 104 and the first and second auxiliary controllers 106*a* and 106*b* may communicate a third set of handshake signals (not shown) to establish asynchronous communication links therebetween.

In response to the third and fourth control signals CS3 and CS4, the primary controller 104 can be further configured to receive the third and fourth acknowledgment signals AK3 and AK4 from the first and second auxiliary controllers 106*a* and 106*b*, respectively. The third and fourth acknowledgment signals AK3 and AK4 can indicate whether the third and fourth self-test operations are executed, respectively. In an embodiment, the third and fourth acknowledgment signals AK3 and AK4 are activated (i.e., are at a logic high state) when the third and fourth self-test operations are executed, respectively. Additionally, the primary controller 104 can be configured to receive, in response to the third and fourth control signals CS3 and CS4, third and fourth status bits SB3 and SB4 from the first and second auxiliary controllers 106*a* and 106*b*, respectively. The third status bit SB3 can indicate whether at least one memory of the first set of memories (i.e., the second test circuit) is faulty. Similarly, the fourth status bit SB4 can indicate whether at least one memory of the second set of memories (i.e., the fifth test circuit) is faulty. In an embodiment, the third and fourth status bits SB3 and SB4 are activated (i.e., are at a logic high state) when at least one memory of the first set of memories and at least one memory of the second set of memories are faulty, respectively.

The primary controller 104 can be further configured to provide, based on the third and fourth acknowledgment signals AK3 and AK4, the fifth and sixth control signals CS5 and CS6 to the first and second auxiliary controllers 106*a* and 106b to facilitate the execution of the fifth and sixth self-test operations, respectively. The primary controller 104 can provide the fifth and sixth control signals CS5 and CS6 to the first and second auxiliary controllers 106a and 106b, respectively, when the third and fourth self-test operations are executed (i.e., when the third and fourth acknowledgment signals AK3 and AK4 are activated). The fifth and sixth control signals CS5 and CS6 can be provided to the first and second auxiliary controllers 106a and 106b, respectively, in one of a serial manner, a parallel manner, and a staggered manner. In an embodiment, prior to providing the fifth and sixth control signals CS5 and CS6 to the first and second auxiliary controllers 106a and 106b, respectively, the primary controller 104 and the first and second auxiliary controllers 106a and 106b may communicate a fourth set of handshake signals (not shown) to establish asynchronous communication links therebetween.

In response to the fifth and sixth control signals CS5 and CS6, the primary controller 104 can be further configured to receive the fifth and sixth acknowledgment signals AK5 and AK6 from the first and second auxiliary controllers 106a and 106b, respectively. The fifth and sixth acknowledgment signals AK5 and AK6 can indicate whether the fifth and sixth self-test operations are executed, respectively. In an embodiment, the fifth and sixth acknowledgment signals AK5 and AK6 are activated (i.e., are at a logic high state) when the fifth and sixth self-test operations are executed, respectively. Additionally, the primary controller 104 can be configured to receive, in response to the fifth and sixth control signals CS5 and CS6, fifth and sixth status bits SB5 and SB6 from the first and second auxiliary controllers 106a and 106b, respectively. The fifth status bit SB5 can indicate whether at least one logic circuit of the first set of logic circuits (i.e., the third test circuit) is faulty. Similarly, the sixth status bit SB6 can indicate whether at least one logic circuit of the second set of logic circuits (i.e., the sixth test circuit) is faulty. In an embodiment, the fifth and sixth status bits SB5 and SB6 are activated (i.e., are at a logic high state) when at least one logic circuit of the first set of logic circuits and at least one logic circuit of the second set of logic circuits are faulty, respectively.

The primary controller 104 can be further configured to provide, based on the fifth and sixth acknowledgment signals AK5 and AK6, the eighth control signal CS8 to the first and second auxiliary controllers 106a and 106b to facilitate the deactivation of the self-test mode of the SoC 100, respectively. The primary controller 104 can provide the eighth control signal CS8 to the first and second auxiliary controllers 106a and 106b when the fifth and sixth self-test operations are executed (i.e., when the fifth and sixth acknowledgment signals AK5 and AK6 are activated). In an embodiment, prior to providing the eighth control signal CS8 to the first and second auxiliary controllers 106a and 106b, the primary controller 104 and the first and second auxiliary controllers 106a and 106b may communicate a fifth set of handshake signals (not shown) to establish asynchronous communication links therebetween.

In response to the eighth control signal CS8, the primary controller 104 can be configured to receive ninth and tenth acknowledgment signals AK9 and AK10 from the first and second auxiliary controllers 106a and 106b, respectively. The ninth and tenth acknowledgment signals AK9 and AK10 can indicate successful deactivation of the self-test mode of the SoC 100 by the first and second auxiliary controllers 106a and 106b, respectively. The deactivation of the self-test mode by the first and second auxiliary controllers 106a and 106b corresponds to deactivation of the select and isolation signals by the first and second auxiliary controllers 106a and 106b to un-gate the clock signals and deisolate the outputs associated with the corresponding partitions in the SoC 100. In an embodiment, the ninth and tenth acknowledgment signals AK9 and AK10 are activated (i.e., are at a logic high state) when the self-test mode is deactivated.

The primary controller 104 can be further configured to generate a fault signal FS based on the first through sixth status bits SB1-SB6. In an embodiment, when one of the first through sixth status bits SB1-SB6 is activated, the primary controller 104 activates the fault signal FS (i.e., generates the fault signal FS at a logic high state). Further, the primary controller 104 can be coupled with the fault controller 126, and configured to provide the fault signal FS to the fault controller 126 to facilitate a fault diagnosis of the SoC 100. In an embodiment, the primary controller 104 may include a first scheduler (not shown) for executing various scheduling operations such as generation of control signals (e.g., the first through eighth control signals CS1-CS8), and a fault aggregator circuit (not shown) for generating the fault signal FS.

The first and second auxiliary controllers 106a and 106b can include suitable logic, circuitry, interfaces, and/or code, executable by the circuitry, that can be configured to perform one or more operations as stated herein. For example, the first and second auxiliary controllers 106a and 106b can be configured to receive second and third configuration data CD2 and CD3, respectively. The second configuration data CD2 can indicate which BIST controllers of the first set of functional BIST controllers, the first set of MBIST controllers, and the first set of LBIST controllers are to be scheduled (i.e., enabled) for executing corresponding self-test operations. The second configuration data CD2 can further indicate the manner (e.g., serial, parallel, or staggered) in which the BIST controllers are to be scheduled. Similarly, the third configuration data CD3 can indicate which BIST controllers of the second set of functional BIST controllers, the second set of MBIST controllers, and the second set of LBIST controllers are to be scheduled (i.e., enabled) for executing corresponding self-test operations. The third configuration data CD3 can further indicate the manner (e.g., serial, parallel, or staggered) in which the BIST controllers are to be scheduled.

The first and second auxiliary controllers 106a and 106b can be coupled with the primary controller 104, and further configured to receive the first and second control signals CS1 and CS2, respectively. The first and second auxiliary controllers 106a and 106b can be further coupled with the first and second functional BIST controllers 108a and 108b, respectively. Further, the first and second auxiliary controllers 106a and 106b can be configured to schedule the execution of the first and second self-test operations on the first and second functional circuits 110a and 110b by the first and second functional BIST controllers 108a and 108b, respectively. The first auxiliary controller 106a can schedule the execution of the first self-test operation based on the first control signal CS1 (i.e., based on the initiation of the BIST sequence) and the second configuration data CD2. Similarly, the second auxiliary controller 106b can schedule the execution of the second self-test operation based on the second control signal CS2 (i.e., based on the initiation of the BIST sequence) and the third configuration data CD3. In an embodiment, the first and second auxiliary controllers 106a and 106b schedule the execution of the first and second self-test operations when the first and second control signals CS1 and CS2 are activated, respectively.

To schedule the execution of the first and second self-test operations, the first and second auxiliary controllers 106a and 106b can be further configured to generate and provide first and second trigger signals TR1 and TR2 to the first and second functional BIST controllers 108a and 108b, respectively. In an embodiment, the first and second self-test operations are executed when the first and second auxiliary controllers 106a and 106b activate the first and second trigger signals TR1 and TR2 (i.e., generate the first and second trigger signals TR1 and TR2 at a logic high state), respectively. In response to the first and second trigger signals TR1 and TR2, the first and second auxiliary controllers 106a and 106b can be further configured to receive, from the first and second functional BIST controllers 108a and 108b, first and second result bits RB1 and RB2 associated with the first and second self-test operations, respectively. The first and second result bits RB1 and RB2 can indicate whether the first and second functional circuits 110a and 110b are faulty, respectively. In an embodiment, the first and second result bits RB1 and RB2 are activated (i.e., are at a logic high state) when the first and second functional circuits 110a and 110b are faulty, respectively.

The first and second auxiliary controllers 106a and 106b can be further configured to generate the first and second acknowledgment signals AK1 and AK2 based on the first and second result bits RB1 and RB2 (i.e., based on the execution of the first and second self-test operations), respectively. In an embodiment, the first and second auxiliary controllers 106a and 106b activate the first and second acknowledgment signals AK1 and AK2 when the first and second result bits RB1 and RB2 are received, respectively. The first and second auxiliary controllers 106a and 106b can be further configured to provide the first and second acknowledgment signals AK1 and AK2 to the primary controller 104 as responses to the first and second control signals CS1 and CS2, respectively. Further, the first and second auxiliary controllers 106a and 106b can be configured to generate and provide the first and second status bits SB1 and SB2 to the primary controller 104. The first and second auxiliary controllers 106a and 106b generate the first and second status bits SB1 and SB2 based on the first and second result bits RB1 and RB2 (i.e., based on the execution of the first and second self-test operations), respectively. The execution of the first and second self-test operations is thus scheduled before the third though sixth self-test operations are executed.

As each of the first and second auxiliary controllers 106a and 106b is coupled with one functional BIST controller (i.e., the first and second functional BIST controllers 108a and 108b, respectively), logic states of the first and second status bits SB1 and SB2 are same as that of the first and second result bits RB1 and RB2, respectively. However, it will be apparent to a person skilled in the art that the scope of the present disclosure is not limited to each of the first and second auxiliary controllers 106a and 106b being coupled with one functional BIST controller. In various other embodiments, the first and second auxiliary controllers 106a and 106b may be coupled with multiple functional BIST controllers each of which is coupled with an associated functional circuit, without deviating from the scope of the present disclosure. In such a scenario, each of the first and second auxiliary controllers 106a and 106b can be configured to schedule the execution of various self-test operations on the functional circuits by the corresponding functional BIST controllers in one of a serial manner, a parallel manner, and a staggered manner.

The first auxiliary controller 106a can provide a trigger signal (such as the first trigger signal TR1) to each functional BIST controller coupled therewith, and in response, receive a result bit (such as the first result bit RB1) from the corresponding functional BIST controller. The first auxiliary controller 106a can include a first register set (not shown) for storing the received result bits. In such a scenario, the first status bit SB1 can be generated based on multiple result bits received by the first auxiliary controller 106a such that the first status bit SB1 is activated when at least one of the received result bits is activated. Similarly, the second auxiliary controller 106b can provide a trigger signal (such as the second trigger signal TR2) to each functional BIST controller coupled therewith, and in response, receive a result bit (such as the second result bit RB2) from the corresponding functional BIST controller. The second auxiliary controller 106b can include a second register set (not shown) for storing the received result bits. In such a scenario, the second status bit SB2 can be generated based on multiple result bits received by the second auxiliary controller 106b such that the second status bit SB2 is activated when at least one of the received result bits is activated.

On providing the first and second acknowledgment signals AK1 and AK2 to the primary controller 104, the first and second auxiliary controllers 106a and 106b can be further configured to receive the seventh control signal CS7 from the primary controller 104. Based on the seventh control signal CS7, the first auxiliary controller 106a can be further configured to generate a first select signal SL1 and a first isolation signal IL1. Similarly, the second auxiliary controller 106b can be further configured to generate a second select signal SL2 and a second isolation signal IL2 based on the seventh control signal CS7. In an embodiment, the first auxiliary controller 106a activates the first select signal SL1 and the first isolation signal IL1 (i.e., generates the first select signal SL1 and the first isolation signal IL1 at a logic high state) to activate the self-test mode. Similarly, the second auxiliary controller 106b activates the second select signal SL2 and the second isolation signal IL2 (i.e., generates the second select signal SL2 and the second isolation signal IL2 at a logic high state) to activate the self-test mode. The self-test mode of the SoC 100 is activated to execute self-test operations on memories (such as the first and second memories 114a and 114b) and logic circuits (such as the first and second logic circuits 118a and 118b) of the SoC 100.

The first and second auxiliary controllers 106a and 106b can be further coupled with the first and second clock gates 120a and 120b, and further configured to provide the first and second select signals SL1 and SL2 to the first and second clock gates 120a and 120b, respectively. In an embodiment, when the first select signal SL1 is activated, clock signals (not shown) associated with the first logic circuit 118a and the first memory 114a are gated. Similarly, when the second select signal SL2 is activated, clock signals (not shown) associated with the second logic circuit 118b and the second memory 114b are gated. Similarly, the first and second auxiliary controllers 106a and 106b can be further coupled with the first and second logic circuits 118a and 118b, and configured to provide the first and second isolation signals IL1 and IL2 to the first and second logic circuits 118a and 118b, respectively. In an embodiment, when the first and second isolation signals IL1 and IL2 are activated, outputs associated with the first and second logic circuits 118a and 118b are isolated (i.e., are not provided to other logic and/or functional circuits of the SoC 100).

The first and second auxiliary controllers 106a and 106b can be further configured to generate the seventh and eighth acknowledgment signals AK7 and AK8 based on the activation of the self-test mode, respectively. In an embodiment, the first and second auxiliary controllers 106a and 106b activate the seventh and eighth acknowledgment signals AK7 and AK8 when the self-test mode is activated, respectively. The first and second auxiliary controllers 106a and 106b can be further configured to provide the seventh and eighth acknowledgment signals AK7 and AK8 to the primary controller 104 as responses to the seventh control signal CS7, respectively.

On providing the seventh and eighth acknowledgment signals AK7 and AK8 to the primary controller 104, the first and second auxiliary controllers 106a and 106b can be further configured to receive the third and fourth control signals CS3 and CS4 from the primary controller 104, respectively. The first and second auxiliary controllers 106a and 106b can be further coupled with the first and second MBIST controllers 112a and 112b, respectively. Based on the third and fourth control signals CS3 and CS4, the first and second auxiliary controllers 106a and 106b can be further configured to schedule the execution of the third and fourth self-test operations on the first and second memories 114a and 114b by the first and second MBIST controllers 112a and 112b, respectively. The first auxiliary controller 106a can schedule the execution of the third self-test operation based on the third control signal CS3 (i.e., based on the initiation of the BIST sequence) and the second configuration data CD2. Similarly, the second auxiliary controller 106b can schedule the execution of the fourth self-test operation based on the fourth control signal CS4 (i.e., based on the initiation of the BIST sequence) and the third configuration data CD3. In an embodiment, the first and second auxiliary controllers 106a and 106b schedule the execution of the third and fourth self-test operations when the third and fourth control signals CS3 and CS4 are activated, respectively.

To schedule the execution of the third and fourth self-test operations, the first and second auxiliary controllers 106a and 106b can be further configured to generate and provide third and fourth trigger signals TR3 and TR4 to the first and second MBIST controllers 112a and 112b, respectively. In an embodiment, the third and fourth self-test operations are executed when the first and second auxiliary controllers 106a and 106b activate the third and fourth trigger signals TR3 and TR4 (i.e., generate the third and fourth trigger signals TR3 and TR4 at a logic high state), respectively. In response to the third and fourth trigger signals TR3 and TR4, the first and second auxiliary controllers 106a and 106b can be further configured to receive, from the first and second MBIST controllers 112a and 112b, third and fourth result bits RB3 and RB4 associated with the third and fourth self-test operations, respectively. The third and fourth result bits RB3 and RB4 can indicate whether the first and second memories 114a and 114b are faulty, respectively. In an embodiment, the third and fourth result bits RB3 and RB4 are activated (i.e., are at a logic high state) when the first and second memories 114a and 114b are faulty, respectively.

The first and second auxiliary controllers 106a and 106b can be further configured to generate the third and fourth acknowledgment signals AK3 and AK4 based on the third and fourth result bits RB3 and RB4 (i.e., based on the execution of the third and fourth self-test operations), respectively. In an embodiment, the first and second auxiliary controllers 106a and 106b activate the third and fourth acknowledgment signals AK3 and AK4 when the third and fourth result bits RB3 and RB4 are received, respectively. The first and second auxiliary controllers 106a and 106b can be further configured to provide the third and fourth acknowledgment signals AK3 and AK4 to the primary controller 104 as responses to the third and fourth control signals CS3 and CS4, respectively. Further, the first and second auxiliary controllers 106a and 106b can be configured to generate and provide the third and fourth status bits SB3 and SB4 to the primary controller 104, respectively. The first and second auxiliary controllers 106a and 106b can generate the third and fourth status bits SB3 and SB4 based on the third and fourth result bits RB3 and RB4 (i.e., based on the execution of the third and fourth self-test operations), respectively. The execution of the third and fourth self-test operations is thus scheduled before the fifth and sixth self-test operations are executed and after the first and second self-test operations are executed.

As each of the first and second auxiliary controllers 106a and 106b is coupled with one MBIST controller (i.e., the first and second MBIST controllers 112a and 112b, respectively), logic states of the third and fourth status bits SB3 and SB4 are same as that of the third and fourth result bits RB3 and RB4, respectively. However, it will be apparent to a person skilled in the art that the scope of the present disclosure is not limited to each of the first and second auxiliary controllers 106a and 106b being coupled with one MBIST controller. In various other embodiments, the first and second auxiliary controllers 106a and 106b may be coupled with multiple MBIST controllers each of which is coupled with an associated memory, without deviating from the scope of the present disclosure. In such a scenario, each of the first and second auxiliary controllers 106a and 106b can be configured to schedule the execution of various self-test operations on the memories by the corresponding MBIST controllers in one of a serial manner, a parallel manner, and a staggered manner.

The first auxiliary controller 106a can provide a trigger signal (such as the third trigger signal TR3) to each MBIST controller coupled therewith, and in response, receive a result bit (such as the third result bit RB3) from the corresponding MBIST controller. The first auxiliary controller 106a can include a third register set (not shown) for storing the received result bits. In such a scenario, the third status bit SB3 is generated based on multiple result bits received by the first auxiliary controller 106a such that the third status bit SB3 is activated when at least one of the received result bits is activated. Similarly, the second auxiliary controller 106b can provide a trigger signal (such as the fourth trigger signal TR4) to each MBIST controller coupled therewith, and in response, receive a result bit (such as the fourth result bit RB4) from the corresponding MBIST controller. The second auxiliary controller 106b can include a fourth register set (not shown) for storing the received result bits. In such a scenario, the fourth status bit SB4 is generated based on multiple result bits received by the second auxiliary controller 106b such that the fourth status bit SB4 is activated when at least one of the received result bits is activated.

On providing the third and fourth acknowledgment signals AK3 and AK4 to the primary controller 104, the first and second auxiliary controllers 106a and 106b can be further configured to receive the fifth and sixth control signals CS5 and CS6 from the primary controller 104, respectively. The first and second auxiliary controllers 106a and 106b can be further coupled with the first and second LBIST controllers 116a and 116b, respectively. Further, the first and second auxiliary controllers 106a and 106b can be configured to schedule the execution of the fifth and sixth self-test operations on the first and second logic circuits 118a and 118b by the first and second LBIST controllers 116a and 116b, respectively. The first auxiliary controller 106a can schedule the execution of the fifth self-test operation based on the fifth control signal CS5 (i.e., based on the initiation of the BIST sequence) and the second configuration data CD2. Similarly, the second auxiliary controller 106b can schedule the execution of the sixth self-test operation based on the sixth control signal CS6 (i.e., based on the initiation of the BIST sequence) and the third configuration data CD3. In an embodiment, the first and second auxiliary controllers 106a and 106b schedule the execution of the fifth and sixth self-test operations when the fifth and sixth control signals CS5 and CS6 are activated, respectively.

To schedule the execution of the fifth and sixth self-test operations, the first and second auxiliary controllers 106a and 106b can be further configured to generate and provide fifth and sixth trigger signals TR5 and TR6 to the first and second LBIST controllers 116a and 116b, respectively. In an embodiment, the fifth and sixth self-test operations are executed when the first and second auxiliary controllers 106a and 106b activate the fifth and sixth trigger signals TR5 and TR6 (i.e., generate the fifth and sixth trigger signals TR5 and TR6 at a logic high state), respectively. In response to the fifth and sixth trigger signals TR5 and TR6, the first and second auxiliary controllers 106a and 106b can be further configured to receive, from the first and second LBIST controllers 116a and 116b, fifth and sixth result bits RB5 and RB6 associated with the fifth and sixth self-test operations, respectively. The fifth and sixth result bits RB5 and RB6 can indicate whether the first and second logic circuits 118a and 118b are faulty, respectively. In an embodiment, the fifth and sixth result bits RB5 and RB6 are activated (i.e., are at a logic high state) when the first and second logic circuits 118a and 118b are faulty, respectively.

The first and second auxiliary controllers 106a and 106b can be further configured to generate the fifth and sixth acknowledgment signals AK5 and AK6 based on the fifth and sixth result bits RB5 and RB6 (i.e., based on the execution of the fifth and sixth self-test operations), respectively. In an embodiment, the first and second auxiliary controllers 106a and 106b activate the fifth and sixth acknowledgment signals AK5 and AK6 when the fifth and sixth result bits RB5 and RB6 are received, respectively. The first and second auxiliary controllers 106a and 106b can be further configured to provide the fifth and sixth acknowledgment signals AK5 and AK6 to the primary controller 104 as responses to the fifth and sixth control signals CS5 and CS6, respectively. Further, the first and second auxiliary controllers 106a and 106b can be configured to generate and provide the fifth and sixth status bits SB5 and SB6 to the primary controller 104, respectively. The first and second auxiliary controllers 106a and 106b can generate the fifth and sixth status bits SB5 and SB6 based on the fifth and sixth result bits RB5 and RB6 (i.e., based on the execution of the fifth and sixth self-test operations), respectively. The first auxiliary controller 106a can thus be configured to sequentially schedule the execution of the first, third, and fifth self-test operations. Similarly, the second auxiliary controller 106b can be configured to sequentially schedule the execution of the second, fourth, and sixth self-test operations.

As each of the first and second auxiliary controllers 106a and 106b is coupled with one LBIST controller (i.e., the first and second LBIST controllers 116a and 116b, respectively), logic states of the fifth and sixth status bits SB5 and SB6 are same as that of the fifth and sixth result bits RB5 and RB6, respectively. However, it will be apparent to a person skilled in the art that the scope of the present disclosure is not limited to each of the first and second auxiliary controllers 106a and 106b being coupled with one LBIST controller. In various other embodiments, the first and second auxiliary controllers 106a and 106b may be coupled with multiple LBIST controllers each of which is coupled with an associated logic circuit, without deviating from the scope of the present disclosure. In such a scenario, each of the first and second auxiliary controllers 106a and 106b can be configured to schedule the execution of various self-test operations on the logic circuits by the corresponding LBIST controllers in one of a serial manner, a parallel manner, and a staggered manner.

The first auxiliary controller 106a can provide a trigger signal (such as the fifth trigger signal TR5) to each LBIST controller coupled therewith, and in response, receive a result bit (such as the fifth result bit RB5) from the corresponding LBIST controller. The first auxiliary controller 106a can include a fifth register set (not shown) for storing the received result bits. In such a scenario, the fifth status bit SB5 is generated based on multiple result bits received by the first auxiliary controller 106a such that the fifth status bit SB5 is activated when at least one of the received result bits is activated. Similarly, the second auxiliary controller 106b can provide a trigger signal (such as the sixth trigger signal TR6) to each LBIST controller coupled therewith, and in response, receive a result bit (such as the sixth result bit RB6) from the corresponding LBIST controller. The second auxiliary controller 106b can include a sixth register set (not shown) for storing the received result bits. In such a scenario, the sixth status bit SB6 is generated based on multiple result bits received by the second auxiliary controller 106b such that the sixth status bit SB6 is activated when at least one of the received result bits is activated.

On providing the fifth and sixth acknowledgment signals AK5 and AK6 to the primary controller 104, the first and second auxiliary controllers 106a and 106b can be further configured to receive the eighth control signal CS8 from the primary controller 104. Based on the eighth control signal CS8, the first auxiliary controller 106a can be further configured to generate and provide first through third reset signals RT1-RT3 to the first MBIST controller 112a, the first LBIST controller 116a, and the first logic circuit 118a, respectively. In an embodiment, when the first through third reset signals RT1-RT3 are activated (i.e., are at a logic high state), the first MBIST controller 112a, the first LBIST controller 116a, and the first logic circuit 118a are reset, respectively. Similarly, based on the eighth control signal CS8, the second auxiliary controller 106b can be further configured to generate and provide fourth through sixth reset signals RT4-RT6 to the second MBIST controller 112b, the second LBIST controller 116b, and the second logic circuit 118b, respectively. In an embodiment, when the fourth through sixth reset signals RT4-RT6 are activated (i.e., are at a logic high state), the second MBIST controller 112b, the second LBIST controller 116b, and the second logic circuit 118b are reset, respectively. In an embodiment, the first auxiliary controller 106a activates the first through third reset signals RT1-RT3, and the second auxiliary controller 106b activates the fourth through sixth reset signals RT4-RT6 when the eighth control signal CS8 is activated. Further, the first through sixth reset signals RT1-RT6 are activated simultaneously.

Although it is described that the first auxiliary controller 106a generates three reset signals (i.e., the first through third reset signals RT1-RT3) to reset the first MBIST controller 112a, the first LBIST controller 116a, and the first logic circuit 118a, and the second auxiliary controller 106b generates three reset signals (i.e., the fourth through sixth reset signals RT4-RT6) to reset the second MBIST controller 112b, the second LBIST controller 116b, and the second logic circuit 118b, it will be apparent to a person skilled in the art that the scope of the present disclosure is not limited to it. In various other embodiments, the first auxiliary controller 106a can be configured to generate a single reset signal to reset the first MBIST controller 112a, the first LBIST controller 116a, and the first logic circuit 118a, and the second auxiliary controller 106b can be further configured to generate a single reset signal to reset the second MBIST controller 112b, the second LBIST controller 116b, and the second logic circuit 118b, without deviating from the scope of the present disclosure.

Based on the eighth control signal CS8, the first auxiliary controller 106a can be further configured to deactivate the first select signal SL1 and the first isolation signal IL1 (i.e., generate the first select signal SL1 and the first isolation signal IL1 at a logic low state). Similarly, the second auxiliary controller 106b can be further configured to deactivate the second select signal SL2 and the second isolation signal IL2 (i.e., generate the second select signal SL2 and the second isolation signal IL2 at a logic low state) based on the eighth control signal CS8. In an embodiment, the first auxiliary controller 106a deactivates the first select signal SL1 and the first isolation signal Ill, and the second auxiliary controller 106b deactivates the second select signal SL2 and the second isolation signal IL2 when the eighth control signal CS8 is activated. Further, the first and second select signals SL1 and SL2 and the first and second isolation signals IL1 and IL2 are deactivated to deactivate the self-test mode of the SoC 100. The self-test mode of the SoC 100 is thus deactivated after the execution of self-test operations on memories (such as the first and second memories 114a and 114b) and logic circuits (such as the first and second logic circuits 118a and 118b) of the SoC 100.

The first and second isolation signals IL1 and IL2 and the first and second select signals SL1 and SL2 are thus activated before the execution of the third and fourth self-test operations is scheduled to activate the self-test mode of the SoC, and deactivated after the generation of the fifth and sixth status bits SB5 and SB6 to deactivate the self-test mode of the SoC. The execution of the third through sixth self-test operations is thus scheduled during the self-test mode of the SoC.

The first and second auxiliary controllers 106a and 106b can be further configured to generate the ninth and tenth acknowledgment signals AK9 and AK10 based on the deactivation of the self-test mode, respectively. In an embodiment, the first and second auxiliary controllers 106a and 106b activate the ninth and tenth acknowledgment signals AK9 and AK10 when the self-test mode is deactivated, respectively. The first and second auxiliary controllers 106a and 106b can be further configured to provide the ninth and tenth acknowledgment signals AK9 and AK10 to the primary controller 104 as responses to the eighth control signal CS8, respectively.

The first and second auxiliary controllers 106a and 106b can include second and third schedulers (not shown) for executing various scheduling operations, respectively. Additionally, the first auxiliary controller 106a can include a first processing circuit (not shown) for generating various isolation signals (such as the first isolation signal IL1), various select signals (such as the first select signal SL1), and various reset signals (such as the first through third reset signals RT1-RT3). Similarly, the second auxiliary controller 106b can include a second processing circuit (not shown) for generating various isolation signals (such as the second isolation signal IL2), various select signals (such as the second select signal SL2), and various reset signals (such as the fourth through sixth reset signals RT4-RT6), respectively.

Although FIG. 1 illustrates that the first auxiliary controller 106a is directly coupled with the first functional BIST controller 108a, the first MBIST controller 112a, and the first LBIST controller 116a, and the second auxiliary controller 106b is directly coupled with the second functional BIST controller 108b, the second MBIST controller 112b, and the second LBIST controller 116b, it will be apparent to a person skilled in the art that the scope of the present disclosure is not limited to it. In various other embodiments, the first auxiliary controller 106a may be coupled with at least one of the first functional BIST controller 108a, the first MBIST controller 112a, and the first LBIST controller 116a by way of a fourth scheduler (not shown). Similarly, the second auxiliary controller 106b may be coupled with at least one of the second functional BIST controller 108b, the second MBIST controller 112b, and the second LBIST controller 116b by way of a fifth scheduler (not shown), without deviating from the scope of the present disclosure. In such a scenario, the first and second auxiliary controllers 106a and 106b may provide trigger signals to and receive result bits from the fourth and fifth schedulers, respectively.

The first and second functional BIST controllers 108a and 108b can be coupled with the first and second auxiliary controllers 106a and 106b, respectively. Further, the first and second functional BIST controllers 108a and 108b can be coupled with the first and second functional circuits 110a and 110b, respectively. The first and second functional BIST controllers 108a and 108b can include suitable logic, circuitry, interfaces, and/or code, executable by the circuitry, that can be configured to perform one or more operations as stated herein. For example, the first and second functional BIST controllers 108a and 108b can be configured to receive fourth and fifth configuration data CD4 and CD5, respectively. The fourth and fifth configuration data CD4 and CD5 can include first and second reference functional BIST values, respectively.

The first and second functional BIST controllers 108a and 108b can be further configured to receive the first and second trigger signals TR1 and TR2 from the first and second auxiliary controllers 106a and 106b, respectively. Based on the fourth configuration data CD4 and the first trigger signal TR1, the first functional BIST controller 108a can be further configured to execute the first self-test operation on the first functional circuit 110a. The second functional BIST controller 108b can similarly be configured to execute the second self-test operation on the second functional circuit 110b based on the fifth configuration data CD5 and the second trigger signal TR2. Examples of the first and second functional circuits 110a and 110b include analog-to-digital converters, power management units, or the like.

To execute the first and second self-test operations, the first and second functional BIST controllers 108a and 108b can be configured to generate and provide first and second enable signals ES1 and ES2 to the first and second functional circuits 110a and 110b, respectively. Based on the execution of the first and second self-test operations, the first and second functional circuits 110a and 110b can be configured to output first and second output data OD1 and OD2, respectively. The first and second functional circuits 110a and 110b can be further configured to provide the first and second output data OD1 and OD2 to the first and second functional BIST controllers 108a and 108b as responses to the first and second enable signals ES1 and ES2, respectively.

The first functional BIST controller 108a can be configured to generate the first result bit RB1 based on the first output data OD1 and the fourth configuration data CD4. Similarly, the second functional BIST controller 108b can be configured to generate the second result bit RB2 based on the second output data OD2 and the fifth configuration data CD5. The first and second result bits RB1 and RB2 indicate whether the first and second functional circuits 110a and 110b are faulty, respectively. In an embodiment, the first and second output data OD1 and OD2 are compared with the first and second reference functional BIST value of the fourth and fifth configuration data CD4 and CD5 to generate the first and second result bits RB1 and RB2, respectively. In such a scenario, the first result bit RB1 is activated when the first output data OD1 and the first reference functional BIST value do not match, and the second result bit RB2 is activated when the second output data OD2 and the second reference functional BIST value do not match.

The first and second MBIST controllers 112a and 112b can be coupled with the first and second auxiliary controllers 106a and 106b, respectively. Further, the first and second MBIST controllers 112a and 112b can be coupled with the first and second memories 114a and 114b, respectively. The first and second MBIST controllers 112a and 112b can include suitable logic, circuitry, interfaces, and/or code, executable by the circuitry, that can be configured to perform one or more operations as stated herein. For example, the first and second MBIST controllers 112a and 112b can be configured to receive sixth and seventh configuration data CD6 and CD7, respectively. The sixth and seventh configuration data CD6 and CD7 can be indicative of first and second reference write data, respectively.

The first and second MBIST controllers 112a and 112b can be further configured to receive the first and fourth reset signals RT1 and RT4 from the first and second auxiliary controllers 106a and 106b, respectively. When the first and fourth reset signals RT1 and RT4 are activated, the first and second MBIST controllers 112a and 112b are reset. When the first and fourth reset signals RT1 and RT4 are deactivated, the first and second MBIST controllers 112a and 112b are operational. Further, the first and second memories 114a and 114b can be coupled with the first and second clock gates 120a and 120b, and configured to receive first and second gating signals GS1 and GS2, respectively. The clock signals associated with the first and second memories 114a and 114b are controlled by way of the first and second gating signals GS1 and GS2, respectively. In an embodiment, when the self-test mode of the SoC 100 is activated, the first and second gating signals GS1 and GS2 are generated such that the clock signals associated with the first and second memories 114a and 114b are gated, respectively.

When the first and second MBIST controllers 112a and 112b are operational, the first and second MBIST controllers 112a and 112b can be configured to receive the third and fourth trigger signals TR3 and TR4 from the first and second auxiliary controllers 106a and 106b, respectively. Based on the sixth configuration data CD6 and the third trigger signal TR3, the first MBIST controller 112a can be further configured to execute the third self-test operation on the first memory 114a. The second MBIST controller 112b can similarly be configured to execute the fourth self-test operation on the second memory 114b based on the seventh configuration data CD7 and the fourth trigger signal TR4. It will be apparent to a person skilled in the art that prior to the execution of the third and fourth self-test operations on the first and second memories 114a and 114b, the clock signals associated with the first and second memories 114a and 114b may be un-gated by the first and second MBIST controllers 112a and 112b, respectively. Examples of the first and second memories 114a and 114b include random-access memories, read-only memories, or the like.

To execute the third and fourth self-test operations, the first and second MBIST controllers 112a and 112b can be configured to generate and provide third and fourth enable signals ES3 and ES4 to the first and second memories 114a and 114b, respectively. It will be apparent to a person skilled in the art that the third and fourth enable signals ES3 and ES4 are multi-bit signals and include the first and second reference write data that are to be written to the first and second memories 114a and 114b, respectively. Based on the execution of the third and fourth self-test operations, the first and second memories 114a and 114b can be configured to output and provide third and fourth output data OD3 and OD4 to the first and second MBIST controllers 112a and 112b, respectively. It will be apparent to a person skilled in the art that the third and fourth output data OD3 and OD4 correspond to data read from the first and second memories 114a and 114b, respectively.

The first MBIST controller 112a can be configured to generate the third result bit RB3 based on the third output data OD3 and the sixth configuration data CD6. Similarly, the second MBIST controller 112b can be configured to generate the fourth result bit RB4 based on the fourth output data OD4 and the seventh configuration data CD7. The third and fourth result bits RB3 and RB4 indicate whether the first and second memories 114a and 114b are faulty, respectively. In an embodiment, the third and fourth output data OD3 and OD4 are compared with the first and second reference write data of the sixth and seventh configuration data CD6 and CD7 to generate the third and fourth result bits RB3 and RB4, respectively. In such a scenario, the third result bit RB3 is activated when the third output data OD3 and the first reference write data do not match, and the fourth result bit RB4 is activated when the fourth output data OD4 and the second reference write data do not match.

The first and second LBIST controllers 116a and 116b can be coupled with the first and second auxiliary controllers 106a and 106b, respectively. Further, the first and second LBIST controllers 116a and 116b can be coupled with the first and second logic circuits 118a and 118b, respectively. The first and second LBIST controllers 116a and 116b can include suitable logic, circuitry, interfaces, and/or code, executable by the circuitry, that can be configured to perform one or more operations as stated herein. For example, the first and second LBIST controllers 116a and 116b can be configured to receive eighth and ninth configuration data CD8 and CD9, respectively. The eighth and ninth configuration data CD8 and CD9 include first and second reference multi-input signature register (MISR) values, first and second shift counts, and first and second initial seed values, respectively.

The first and second LBIST controllers 116a and 116b can be further configured to receive the second and fifth reset signals RT2 and RT5 from the first and second auxiliary controllers 106a and 106b, respectively. When the second and fifth reset signals RT2 and RT5 are activated, the first and second LBIST controllers 116a and 116b are reset. When the second and fifth reset signals RT2 and RT5 are deactivated, the first and second LBIST controllers 116a and 116b are operational. Further, the first and second logic circuits 118a and 118b can be coupled with the first and second auxiliary controllers 106a and 106b, and configured to receive the third and sixth reset signals RT3 and RT6, respectively. When the third and sixth reset signals RT3 and RT6 are activated, the first and second logic circuits 118a and 118b are reset. When the third and sixth reset signals RT3 and RT6 are deactivated, the first and second logic circuits 118a and 118b are operational. The first and second LBIST controllers 116a and 116b and the first and second logic circuits 118a and 118b are reset after the self-test mode of the SoC 100 is deactivated.

The first and second logic circuits 118a and 118b can be coupled with the first and second clock gates 120a and 120b, and configured to receive the first and second gating signals GS1 and GS2, respectively. The clock signals associated with the first and second logic circuits 118a and 118b are controlled by way of the first and second gating signals GS1 and GS2, respectively. In an embodiment, when the self-test mode of the SoC 100 is activated, the first and second gating signals GS1 and GS2 are generated such that the clock signals associated with the first and second logic circuits 118a and 118b are gated, respectively. Further, the first and second logic circuits 118a and 118b can be configured to receive the first and second isolation signals IL1 and IL2 from the first and second auxiliary controllers 106a and 106b, respectively. The first and second isolation signals IL1 and IL2 are activated during the self-test mode of the SoC 100. Thus, the outputs of the first and second logic circuits 118a and 118b are isolated during the self-test mode of the SoC 100. Examples of the first and second logic circuits 118a and 118b include combinational circuits (such as multiplexers, adders, decoders, or the like) and sequential circuits (such as flip-flops, counters, or the like).

The first and second LBIST controllers 116a and 116b can be further configured to receive the fifth and sixth trigger signals TR5 and TR6 from the first and second auxiliary controllers 106a and 106b, respectively. Based on the eighth configuration data CD8 and the fifth trigger signal TR5, the first LBIST controller 116a can be further configured to execute the fifth self-test operation on the first logic circuit 118a. The second LBIST controller 116b can similarly be configured to execute the sixth self-test operation on the second logic circuit 118b based on the ninth configuration data CD9 and the sixth trigger signal TR6. It will be apparent to a person skilled in the art that prior to the execution of the fifth and sixth self-test operations on the first and second logic circuits 118a and 118b, the clock signals associated with the first and second logic circuits 118a and 118b may be un-gated by the first and second LBIST controllers 116a and 116b, respectively.

To execute the fifth and sixth self-test operations, the first and second LBIST controllers 116a and 116b can be configured to generate and provide fifth and sixth enable signals ES5 and ES6 to the first and second logic circuits 118a and 118b, respectively. Based on the execution of the fifth and sixth self-test operations, the first and second logic circuits 118a and 118b can be configured to output and provide fifth and sixth output data OD5 and OD6 to the first and second LBIST controllers 116a and 116b, respectively. The first LBIST controller 116a can then be configured to generate the fifth result bit RB5 based on the fifth output data OD5 and the eighth configuration data CD8. Similarly, the second LBIST controller 116b can then be configured to generate the sixth result bit RB6 based on the sixth output data OD6 and the ninth configuration data CD9. The fifth and sixth result bits RB5 and RB6 indicate whether the first and second logic circuits 118a and 118b are faulty, respectively.

In an embodiment, the fifth and sixth output data OD5 and OD6 are compared with the first and second reference MISR values of the eighth and ninth configuration data CD8 and CD9 to generate the fifth and sixth result bits RB5 and RB6, respectively. In such a scenario, the fifth result bit RB5 is activated when the fifth output data OD5 and the first reference MISR value do not match, and the sixth result bit RB6 is activated when the sixth output data OD6 and the second reference MISR value do not match.

The first clock gate 120a can be coupled with the first auxiliary controller 106a and a first select signal generator (not shown), and configured to receive the first select signal SL1 and a third select signal SL3, respectively. Based on one of the first and third select signals SL1 and SL3, the first clock gate 120a can be configured to generate the first gating signal GS1. The first clock gate 120a can be further coupled with the first memory 114a and the first logic circuit 118a, and further configured to provide the first gating signal GS1 to the first memory 114a and the first logic circuit 118a. Prior to activating the self-test mode of the SoC 100, the first gating signal GS1 can be generated based on the third select signal SL3. In such a scenario, the clock signals associated with the first memory 114a and the first logic circuit 118a remain un-gated. When the self-test mode of the SoC 100 is activated, the first gating signal GS1 can be generated based on the first select signal SL1. In such a scenario, the clock signals associated with the first memory 114a and the first logic circuit 118a are gated.

The second clock gate 120b can be coupled with the second auxiliary controller 106b and a second select signal generator (not shown), and configured to receive the second select signal SL2 and a fourth select signal SL4, respectively. Based on one of the second and fourth select signals SL2 and SL4, the second clock gate 120b can be configured to generate the second gating signal GS2. The second clock gate 120b can be further coupled with the second memory 114b and the second logic circuit 118b, and further configured to provide the second gating signal GS2 to the second memory 114b and the second logic circuit 118b. Prior to activating the self-test mode of the SoC 100, the second gating signal GS2 can be generated based on the fourth select signal SL4. In such a scenario, the clock signals associated with the second memory 114b and the second logic circuit 118b remain un-gated. When the self-test mode of the SoC 100 is activated, the second gating signal GS2 can be generated based on the second select signal SL2. In such a scenario, the clock signals associated with the second memory 114b and the second logic circuit 118b are gated.

The core circuit 122 is coupled with the interconnect 124. The core circuit 122 can include suitable logic, circuitry, interfaces, and/or code, executable by the circuitry, that can be configured to perform one or more operations as stated herein. For example, the core circuit 122 can be configured to generate the first through ninth configuration data CD1-CD9. The core circuit 122 can further be configured to provide, by way of the interconnect 124, the first through ninth configuration data CD1-CD9 to the primary controller 104, the first and second auxiliary controllers 106a and 106b, the first and second functional BIST controllers 108a and 108b, the first and second MBIST controllers 112a and 112b, and the first and second LBIST controllers 116a and 116b respectively.

The interconnect 124 can be coupled with the core circuit 122, and configured to receive the first through ninth configuration data CD1-CD9 from the core circuit 122. Further, the interconnect 124 can be coupled with the primary controller 104 and the first and second auxiliary controllers 106a and 106b, and configured to provide the first through third configuration data CD1-CD3 to the primary controller 104 and the first and second auxiliary controllers 106a and 106b, respectively. The interconnect 124 can similarly be coupled with the first and second functional BIST controllers 108a and 108b, and configured to provide the fourth and fifth configuration data CD4 and CD5 to the first and second functional BIST controllers 108a and 108b, respectively. Further, the interconnect 124 can be coupled with the first and second MBIST controllers 112a and 112b and the first and second LBIST controllers 116a and 116b, and configured to provide the sixth through ninth configuration data CD6-CD9 to the first and second MBIST controllers 112a and 112b and the first and second LBIST controllers 116a and 116b, respectively.

The fault controller 126 can be coupled with the primary controller 104. The fault controller 126 can include suitable logic, circuitry, interfaces, and/or code, executable by the circuitry, that can be configured to perform one or more operations as stated herein. For example, the fault controller 126 can be configured to receive the fault signal FS from the primary controller 104. Based on the fault signal FS, the fault controller 126 can be configured to initiate the fault diagnosis of the SoC 100. In an embodiment, the fault controller 126 initiates the fault diagnosis of the SoC 100 when the fault signal FS is activated. Once the fault diagnosis of the SoC 100 is initiated, the core circuit 122 can be configured to determine which of the first and second functional circuits 110a and 110b, the first and second memories 114a and 114b, and the first and second logic circuits 118a and 118b are faulty by accessing the first and second auxiliary controllers 106a and 106b, and implement various fault management operations thereon.

Although FIG. 1 illustrates that the SoC 100 includes the control system 102, the first and second sets of functional BIST controllers, the first and second sets of functional circuits, the first and second sets of MBIST controllers, the first and second sets of memories, the first and second sets of LBIST controllers, and the first and second sets of logic circuits, it will be apparent to a person skilled in the art that the scope of the present disclosure is not limited to it. In various other embodiments, the SoC 100 may additionally include third and fourth sets of logic circuits (not shown), without deviating from the scope of the present disclosure. In such a scenario, the first and second auxiliary controllers 106a and 106b may be configured to isolate outputs of the third and fourth sets of logic circuits when the self-test mode of the SoC 100 is activated, respectively.

FIGS. 2A-2E, collectively, represent a flow chart 200 that illustrates a method for facilitating the BIST of the SoC 100 by the control system 102 in accordance with an embodiment of the present disclosure. The core circuit 122 can generate and provide the first through ninth configuration data CD1-CD9 to the interconnect 124.

Figure 2A:
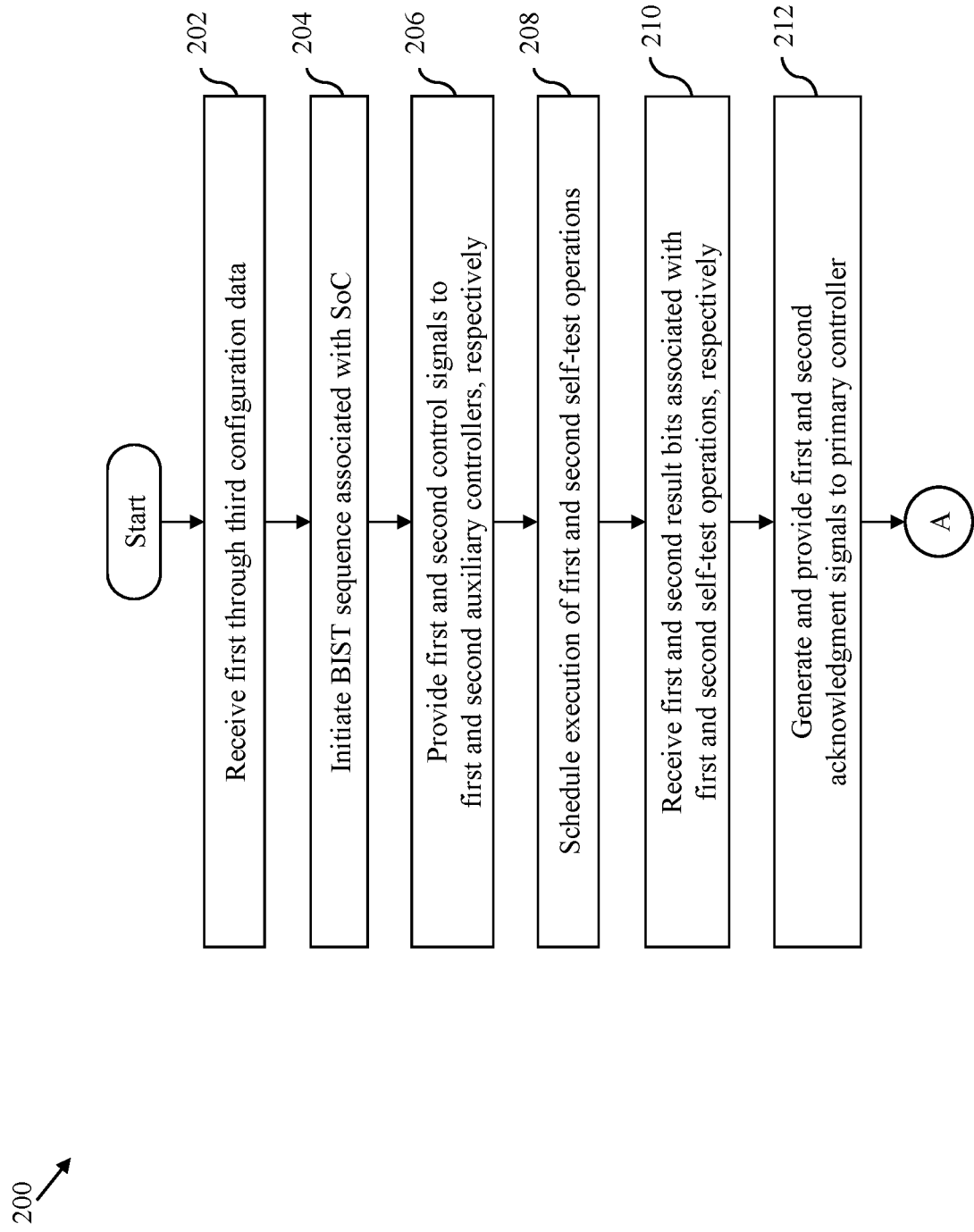
FIGS. 2A-2E, collectively, represent a flow chart that illustrates a method for facilitating a built-in self-test of the SoC of FIG. 1 by the control system in accordance with an embodiment of the present disclosure.

Referring now to FIG. 2A, at step 202, the primary controller 104, the first auxiliary controller 106a, and the second auxiliary controller 106b can receive the first through third configuration data CD1-CD3 from the core circuit 122 by way of the interconnect 124, respectively. Similarly, the first and second functional BIST controllers 108a and 108b, the first and second MBIST controllers 112a and 112b, and the first and second LBIST controllers 116a and 116b can receive the fourth through ninth configuration data CD4-CD9 from the core circuit 122 by way of the interconnect 124, respectively.

At step 204, the primary controller 104 can initiate the BIST sequence associated with the SoC 100 based on the first configuration data CD1. In other words, the primary controller 104 can generate the first through eighth control signals CS1-CS8 based on the first configuration data CD1. At step 206, the primary controller 104 can provide the first and second control signals CS1 and CS2 to the first and second auxiliary controllers 106a and 106b, respectively.

At step 208, the first and second auxiliary controllers 106a and 106b can schedule the execution of the first and second self-test operations on the first and second functional circuits 110a and 110b by the first and second functional BIST controllers 108a and 108b, respectively. The first auxiliary controller 106a can schedule the execution of the first self-test operation based on the first control signal CS1 and the second configuration data CD2. Similarly, the second auxiliary controller 106b can schedule the execution of the second self-test operation based on the second control signal CS2 and the third configuration data CD3. To schedule the execution of the first and second self-test operations, the first and second auxiliary controllers 106a and 106b can generate and provide the first and second trigger signals TR1 and TR2 to the first and second functional BIST controllers 108a and 108b, respectively. When the first and second trigger signals TR1 and TR2 are activated, the first and second functional BIST controllers 108a and 108b execute the first and second self-test operations on the first and second functional circuits 110a and 110b, respectively.

At step 210, the first and second auxiliary controllers 106a and 106b can receive the first and second result bits RB1 and RB2 associated with the first and second self-test operations from the first and second functional BIST controllers 108a and 108b, respectively. At step 212, the first and second auxiliary controllers 106a and 106b can generate and provide, based on the execution of the first and second self-test operations, the first and second acknowledgment signals AK1 and AK2 to the primary controller 104 as responses to the first and second control signals CS1 and CS2, respectively.

Figure 2B:
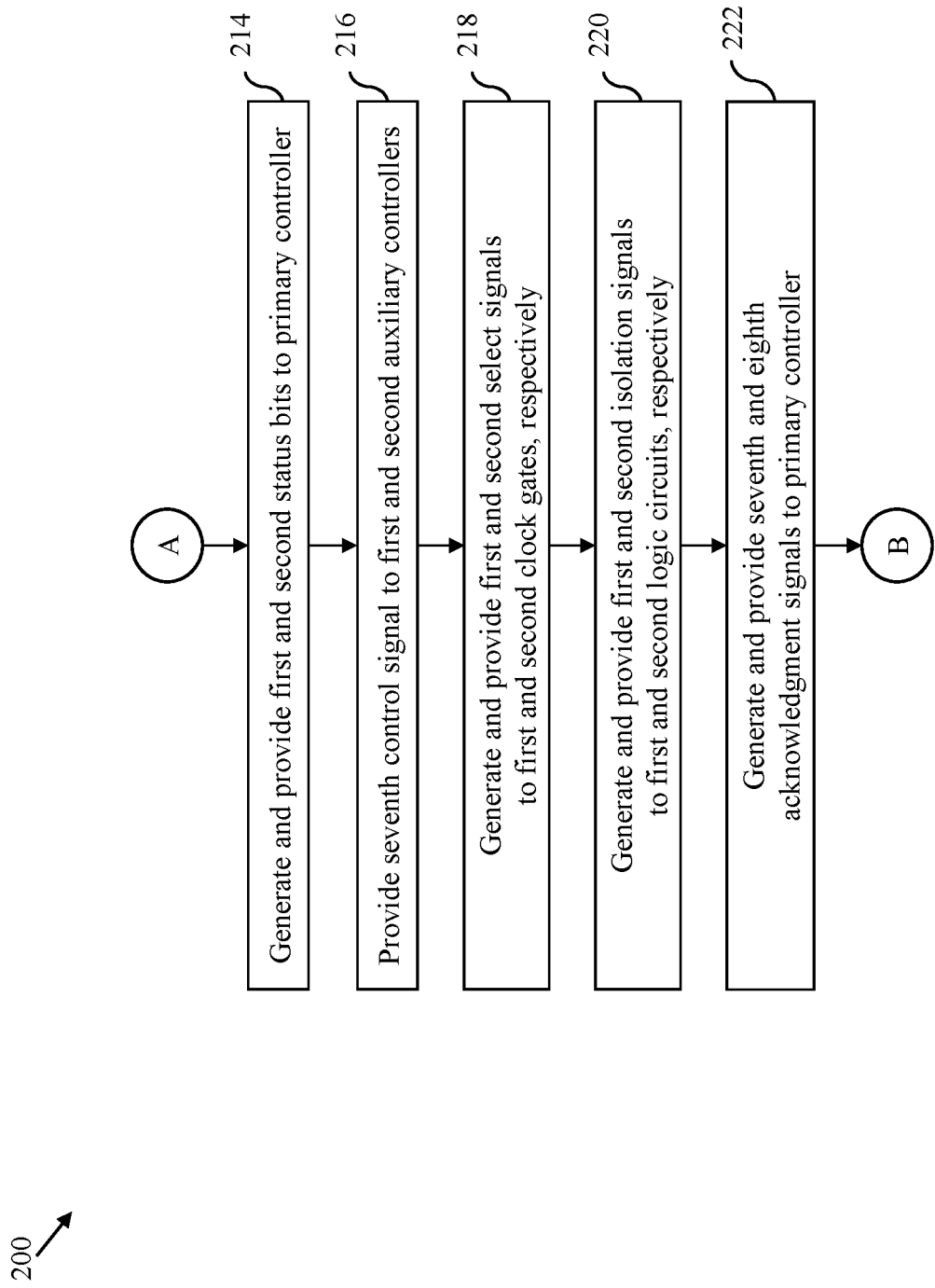

Referring now to FIG. 2B, at step 214, the first and second auxiliary controllers 106a and 106b can generate and provide, based on the execution of the first and second self-test operations, the first and second status bits SB1 and SB2 to the primary controller 104, respectively. The execution of the first and second self-test operations is thus scheduled before the third though sixth self-test operations are executed.

At step 216, the primary controller 104 can provide the seventh control signal CS7 to the first and second auxiliary controllers 106a and 106b to facilitate the activation of the self-test mode of the SoC 100. At step 218, the first and second auxiliary controllers 106a and 106b can generate and provide the first and second select signals SL1 and SL2 to the first and second clock gates 120a and 120b, respectively. In an embodiment, the first and second auxiliary controllers 106a and 106b activate the first and second select signals SL1 and SL2 when the seventh control signal CS7 is activated, respectively. Further, the first and second select signals SL1 and SL2 are activated to activate the self-test mode of the SoC 100. Thus, the activated first and second select signals SL1 and SL2 are provided to the first and second clock gates 120a and 120b during the self-test mode of the SoC 100, respectively. The first and second clock gates 120a and 120b can additionally receive the third and fourth select signals SL3 and SL4, respectively. The first clock gate 120a can then generate the first gating signal GS1 based on one of the first and third select signals SL1 and SL3. Similarly, the second clock gate 120b can generate the second gating signal GS2 based on one of the second and fourth select signals SL2 and SL4. During the self-test mode of the SoC 100, the first and second clock gates 120a and 120b generate the first and second gating signals GS1 and GS2 based on the first and second select signals SL1 and SL2, respectively. The first clock gate 120a can provide the first gating signal GS1 to the first memory 114a and the first logic circuit 118a to gate the associated clock signals. Similarly, the second clock gate 120b can provide the second gating signal GS2 to the second memory 114b and the second logic circuit 118b to gate the associated clock signals.

At step 220, the first and second auxiliary controllers 106a and 106b can generate and provide the first and second isolation signals IL1 and IL2 to the first and second logic circuits 118a and 118b, respectively. In an embodiment, the first and second auxiliary controllers 106a and 106b activate the first and second isolation signals IL1 and IL2 when the seventh control signal CS7 is activated, respectively. The first and second isolation signals IL1 and IL2 are activated to activate the self-test mode of the SoC 100. The activated first and second isolation signals IL1 and IL2 are provided to the first and second logic circuits 118a and 118b to isolate the outputs associated with the first and second logic circuits 118a and 118b during the self-test mode of the SoC 100, respectively. At step 222, the first and second auxiliary controllers 106a and 106b can generate and provide, based on the activation of the self-test mode, the seventh and eighth acknowledgment signals AK7 and AK8 to the primary controller 104 as responses to the seventh control signal CS7, respectively.

Figure 2C:
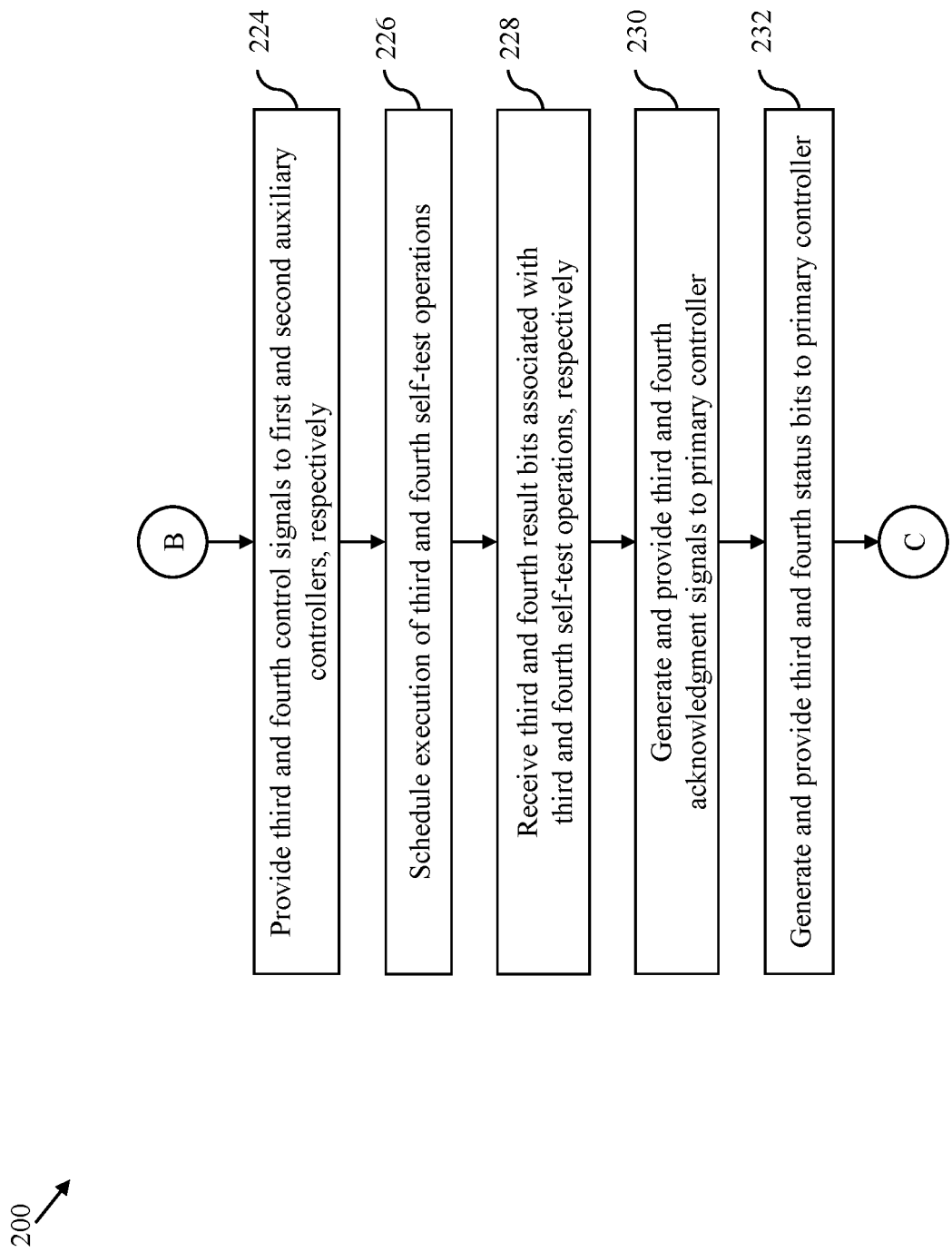

Referring now to FIG. 2C, at step 224, the primary controller 104 can provide the third and fourth control signals CS3 and CS4 to the first and second auxiliary controllers 106a and 106b, respectively. The primary controller 104 can provide the third and fourth control signals CS3 and CS4 to the first and second auxiliary controllers 106a and 106b, respectively, based on the seventh and eighth acknowledgment signals AK7 and AK8.

At step 226, the first and second auxiliary controllers 106a and 106b can schedule the execution of the third and fourth self-test operations on the first and second memories 114a and 114b by the first and second MBIST controllers 112a and 112b, respectively. The first auxiliary controller 106a can schedule the execution of the third self-test operation based on the third control signal CS3 and the second configuration data CD2. Similarly, the second auxiliary controller 106b can schedule the execution of the fourth self-test operation based on the fourth control signal CS4 and the third configuration data CD3. To schedule the execution of the third and fourth self-test operations, the first and second auxiliary controllers 106a and 106b can generate and provide the third and fourth trigger signals TR3 and TR4 to the first and second MBIST controllers 112a and 112b, respectively. When the third and fourth trigger signals TR3 and TR4 are activated, the first and second MBIST controllers 112a and 112b execute the third and fourth operations on the first and second memories 114a and 114b and generate the third and fourth result bits RB3 and RB4, respectively. At step 228, the first and second auxiliary controllers 106a and 106b can receive, from the first and second MBIST controllers 112a and 112b, the third and fourth result bits RB3 and RB4 associated with the third and fourth self-test operations, respectively.

At step 230, the first and second auxiliary controllers 106a and 106b can generate and provide, based on the execution of the third and fourth self-test operations, the third and fourth acknowledgment signals AK3 and AK4 to the primary controller 104 as responses to the third and fourth control signals CS3 and CS4, respectively. At step 232, the first and second auxiliary controllers 106a and 106b can generate and provide, based on the execution of the third and fourth self-test operations, the third and fourth status bits SB3 and SB4 to the primary controller 104, respectively. The execution of the third and fourth self-test operations is thus scheduled before the fifth and sixth self-test operations are executed and after the first and second self-test operations are executed.

Figure 2D:
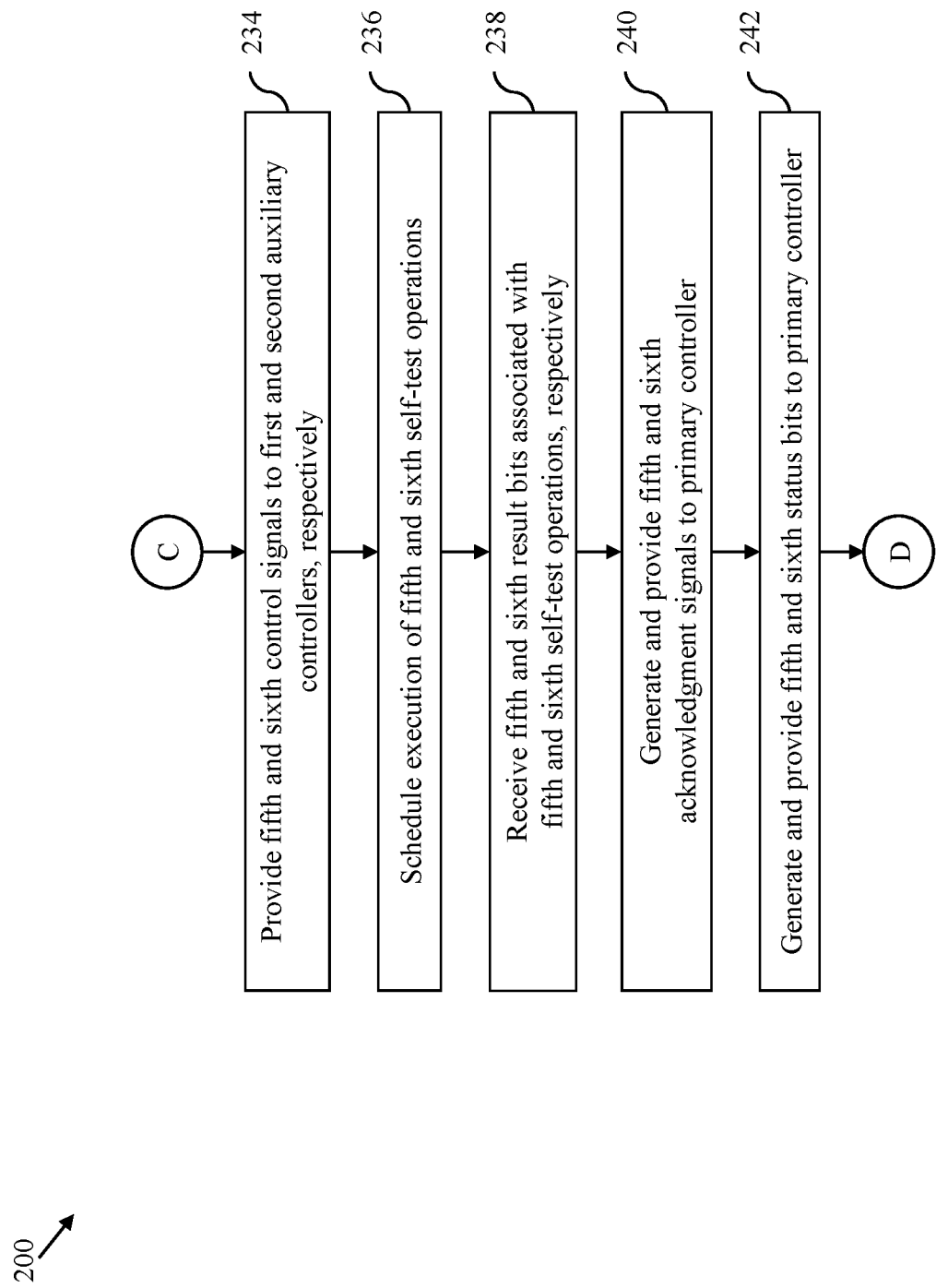

Referring now to FIG. 2D, at step 234, the primary controller 104 provides the fifth and sixth control signals CS5 and CS6 to the first and second auxiliary controllers 106a and 106b, respectively. The primary controller 104 provides the fifth and sixth control signals CS5 and CS6 to the first and second auxiliary controllers 106a and 106b, respectively, based on the third and fourth acknowledgment signals AK3 and AK4. At step 236, the first and second auxiliary controllers 106a and 106b can schedule the execution of the fifth and sixth self-test operations on the first and second logic circuits 118a and 118b by the first and second LBIST controllers 116a and 116b, respectively. The first auxiliary controller 106a can schedule the execution of the fifth self-test operation based on the fifth control signal CS5 and the second configuration data CD2. Similarly, the second auxiliary controller 106b can schedule the execution of the sixth self-test operation based on the sixth control signal CS6 and the third configuration data CD3. To schedule the execution of the fifth and sixth self-test operations, the first and second auxiliary controllers 106a and 106b can generate and provide the fifth and sixth trigger signals TR5 and TR6 to the first and second LBIST controllers 116a and 116b, respectively. When the fifth and sixth trigger signals TR5 and TR6 are activated, the first and second LBIST controllers 116a and 116b can execute the fifth and sixth self-test operations on the first and second logic circuits 118a and 118b and generate the fifth and sixth result bits RB5 and RB6, respectively.

At step 238, the first and second auxiliary controllers 106a and 106b can receive, from the first and second LBIST controllers 116a and 116b, the fifth and sixth result bits RB5 and RB6 associated with the fifth and sixth self-test operations, respectively. At step 240, the first and second auxiliary controllers 106a and 106b can generate and provide, based on the execution of the fifth and sixth self-test operations, the fifth and sixth acknowledgment signals AK5 and AK6 to the primary controller 104 as responses to the fifth and sixth control signals CS5 and CS6, respectively. At step 242, the first and second auxiliary controllers 106a and 106b can generate and provide, based on the execution of the fifth and sixth self-test operations, the fifth and sixth status bits SB5 and SB6 to the primary controller 104. The first auxiliary controller 106a can thus be configured to sequentially schedule the execution of the first, third, and fifth self-test operations. Similarly, the second auxiliary controller 106b can be configured to sequentially schedule the execution of the second, fourth, and sixth self-test operations.

Figure 2E:
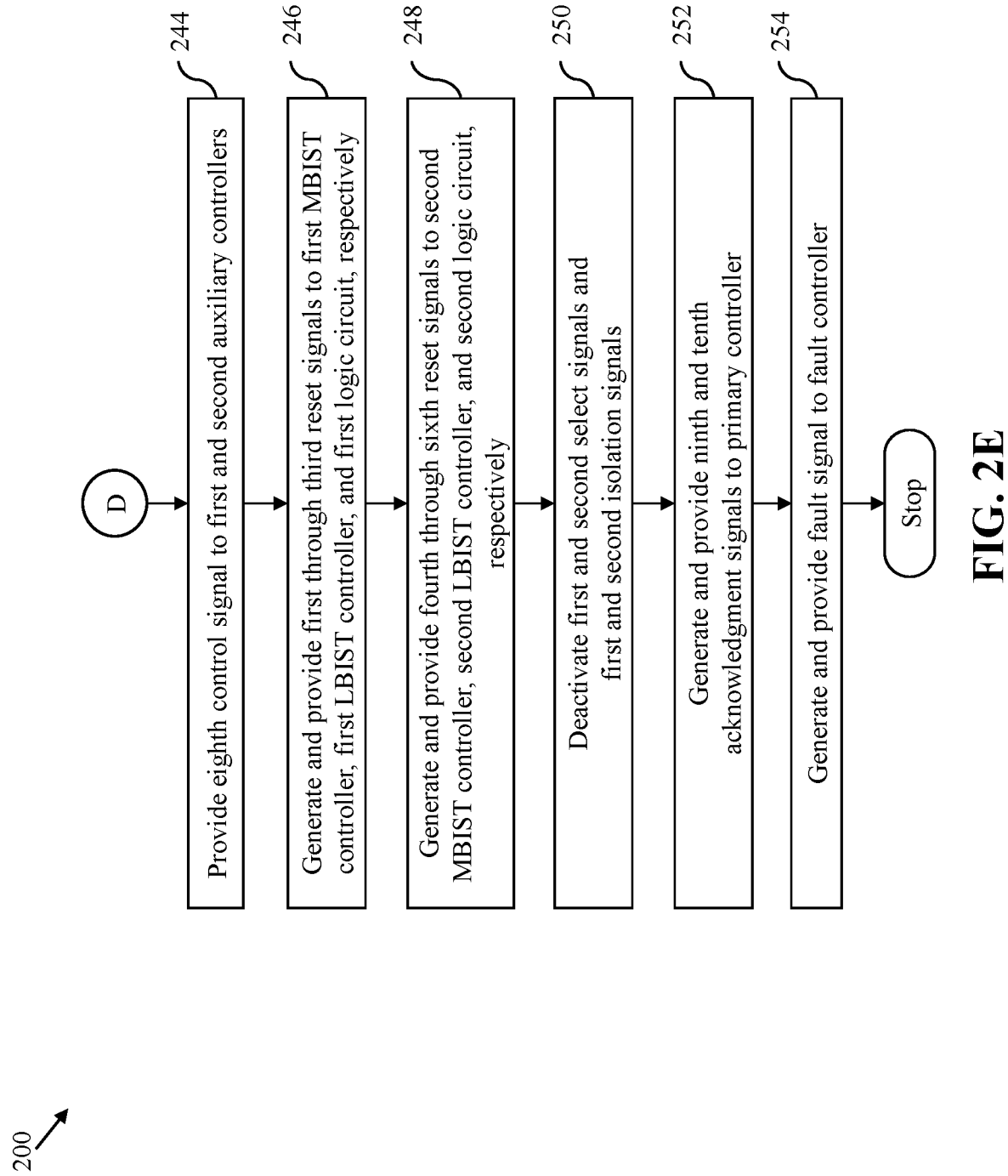

Referring now to FIG. 2E, at step 244, the primary controller 104 can provide the eighth control signal CS8 to the first and second auxiliary controllers 106a and 106b to facilitate the deactivation of the self-test mode of the SoC 100. At step 246, the first auxiliary controller 106a can generate and provide, based on the eighth control signal CS8, the first through third reset signals RT1-RT3 to the first MBIST controller 112a, the first LBIST controller 116a, and the first logic circuit 118a, respectively. In an embodiment, when the first through third reset signals RT1-RT3 are activated, the first MBIST controller 112a, the first LBIST controller 116a, and the first logic circuit 118a are reset, respectively. At step 248, the second auxiliary controller 106b can generate and provide, based on the eighth control signal CS8, the fourth through sixth reset signals RT4-RT6 to the second MBIST controller 112b, the second LBIST controller 116b, and the second logic circuit 118b, respectively. In an embodiment, when the fourth through sixth reset signals RT4-RT6 are activated, the second MBIST controller 112b, the second LBIST controller 116b, and the second logic circuit 118b are reset, respectively. The first and second MBIST controllers 112a and 112b, the first and second LBIST controllers 116a and 116b, and the first and second logic circuits 118a and 118b are reset after the self-test mode of the SoC 100 is deactivated.

At step 250, the first auxiliary controller 106a can deactivate the first isolation signal IL1 and the first select signal SL1, and the second auxiliary controller 106b can deactivate the second isolation signal IL2 and the second select signal SL2 to deactivate the self-test mode of the SoC 100. Thus, the execution of the third through sixth self-test operations is scheduled during the self-test mode of the SoC 100. At step 252, the first and second auxiliary controllers 106a and 106b can generate and provide, based on the deactivation of the self-test mode, the ninth and tenth acknowledgment signals AK9 and AK10 to the primary controller 104 as responses to the eighth control signal CS8, respectively. At step 254, the primary controller 104 can generate and provide, based on the first through sixth status bits SB1-SB6, the fault signal FS to the fault controller 126 to facilitate the fault diagnosis of the SoC 100.

Thus, the control system 102 of the present disclosure can control various types of BIST controllers (e.g., the first and second functional BIST controllers 108a and 108b, the first and second MBIST controllers 112a and 112b, and the first and second LBIST controllers 116a and 116b). Hence, a degree of the BIST facilitated by the control system 102 of the present disclosure is greater than that facilitated by a conventional control system that is capable of controlling exclusively one type of BIST controllers. Further, the core circuit 122 configures various components of the SoC 100 (such as the first and second functional BIST controllers 108a and 108b, the first and second MBIST controllers 112a and 112b, and the first and second LBIST controllers 116a and 116b) to execute corresponding self-test operations. As a result, a programming overhead on the control system 102 of the present disclosure is significantly less than that on the conventional control system where the control system is required to configure associated BIST controllers. Further, the primary controller 104 is coupled with the first and second auxiliary controllers 106a and 106b in an asynchronous manner (i.e., by way of an asynchronous interface). As a result, a design complexity of the control system 102 of the present disclosure is significantly less than that of the conventional control system where a primary controller is synchronously coupled with various auxiliary controllers. The asynchronous coupling between the primary controller 104 and the first and second auxiliary controllers 106a and 106b further ensures that the design complexity of the control system 102 remains unaffected by an increase in a number of auxiliary controllers in the SoC. Hence, the scalability of the SoC 100 that includes the control system 102 of the present disclosure is less complex than that of an SoC including the conventional control system. Thus, the control system 102 of the present disclosure facilitates the BIST of the SoC 100 in a more efficient manner as compared to conventional control systems.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A control system for facilitating a built-in self-test (BIST) of a system-on-chip (SoC), the control system comprising:
a primary controller configured to initiate a BIST sequence associated with the SoC; and
a plurality of auxiliary controllers coupled with the primary controller, wherein a first auxiliary controller of the plurality of auxiliary controllers is configured to:
sequentially schedule, based on the initiation of the BIST sequence, execution of first through third sets of self-test operations on first through third test circuits of the SoC by a set of functional BIST controllers, a set of memory BIST (MBIST) controllers, and a set of logic BIST (LBIST) controllers of the SoC, respectively; and
provide, to the primary controller based on the execution of the first through third sets of self-test operations, first through third status bits that indicate whether at least one functional circuit of the first test circuit, at least one memory of the second test circuit, and at least one logic circuit of the third test circuit are faulty, respectively wherein:
the primary controller is further configured to generate, to initiate the BIST sequence, seventh and eighth control signals, and provide the seventh and eighth control signals to the first auxiliary controller before the execution of the second set of self-test operations is scheduled and after the third set of self-test operations is executed, respectively,
the first auxiliary controller is further configured to generate a set of isolation signals and a set of select signals such that the set of isolation signals and the set of select signals are activated when the seventh control signal is activated, and deactivated when the eighth control signal is activated,
the set of isolation signals and the set of select signals are activated to activate a self-test mode of the SoC, and deactivated to deactivate the self-test mode of the SoC, and
the execution of the second and third sets of self-test operations is scheduled during the self-test mode of the SoC.

2. The control system of claim 1, wherein to initiate the BIST sequence, the primary controller is further configured to generate first through third control signals associated with the first through third sets of self-test operations, respectively.

3. The control system of claim 2, wherein the primary controller is further configured to provide the first control signal to the first auxiliary controller, wherein the first auxiliary controller schedules the execution of the first set of self-test operations when the first control signal is activated, and wherein the first auxiliary controller is further configured to generate and provide, to the primary controller as a response to the first control signal, a first acknowledgment signal such that the first acknowledgment signal is activated when the first set of self-test operations is executed.

4. The control system of claim 3, wherein the first auxiliary controller schedules the execution of the first set of self-test operations in one of a serial manner, a parallel manner, and a staggered manner, wherein the first auxiliary controller is further coupled with the set of functional BIST controllers, and wherein to schedule the execution of the first set of self-test operations, the first auxiliary controller is further configured to generate and provide a first set of trigger signals to the set of functional BIST controllers such that each self-test operation of the first set of self-test operations is executed when a corresponding trigger signal of the first set of trigger signals is activated.

5. The control system of claim 3, wherein the first test circuit includes a set of functional circuits, wherein the first auxiliary controller is further configured to receive, from the set of functional BIST controllers, a first set of result bits associated with the first set of self-test operations such that each result bit of the first set of result bits indicates whether a corresponding functional circuit of the set of functional circuits is faulty, and wherein the first auxiliary controller is further configured to generate the first status bit based on the first set of result bits.

6. The control system of claim 3, wherein the primary controller is further configured to provide, based on the first acknowledgment signal, the second control signal to the first auxiliary controller, wherein the first auxiliary controller schedules the execution of the second set of self-test operations when the second control signal is activated, and wherein the first auxiliary controller is further configured to generate and provide, to the primary controller as a response to the second control signal, a second acknowledgment signal such that the second acknowledgment signal is activated when the second set of self-test operations is executed.

7. The control system of claim 6, wherein the first auxiliary controller schedules the execution of the second set of self-test operations in one of a serial manner, a parallel manner, and a staggered manner, wherein the first auxiliary controller is further coupled with the set of MBIST controllers, and wherein to schedule the execution of the second set of self-test operations, the first auxiliary controller is further configured to generate and provide a second set of trigger signals to the set of MBIST controllers such that each self-test operation of the second set of self-test operations is executed when a corresponding trigger signal of the second set of trigger signals is activated.

8. The control system of claim 6, wherein the second test circuit includes a set of memories, wherein the first auxiliary controller is further configured to receive, from the set of MBIST controllers, a second set of result bits associated with the second set of self-test operations such that each result bit of the second set of result bits indicates whether a corresponding memory of the set of memories is faulty, and wherein the first auxiliary controller is further configured to generate the second status bit based on the second set of result bits.

9. The control system of claim 6, wherein the primary controller is further configured to provide, based on the second acknowledgment signal, the third control signal to the first auxiliary controller, wherein the first auxiliary controller schedules the execution of the third set of self-test operations when the third control signal is activated, and wherein the first auxiliary controller is further configured to generate and provide, to the primary controller as a response to the third control signal, a third acknowledgment signal such that the third acknowledgment signal is activated when the third set of self-test operations is executed.

10. The control system of claim 9, wherein the first auxiliary controller schedules the execution of the third set of self-test operations in one of a serial manner, a parallel manner, and a staggered manner, wherein the first auxiliary controller is further coupled with the set of LBIST controllers, and wherein to schedule the execution of the third set of self-test operations, the first auxiliary controller is further configured to generate and provide a third set of trigger signals to the set of LBIST controllers such that each self-test operation of the third set of self-test operations is executed when a corresponding trigger signal of the third set of trigger signals is activated.

11. The control system of claim 9, wherein the third test circuit includes a set of logic circuits, wherein the first auxiliary controller is further configured to receive, from the set of LBIST controllers, a third set of result bits associated with the third set of self-test operations such that each result bit of the third set of result bits indicates whether a corresponding logic circuit of the set of logic circuits is faulty, and wherein the first auxiliary controller is further configured to generate the third status bit based on the third set of result bits.

12. The control system of claim 2, wherein the primary controller is further configured to:
generate, to initiate the BIST sequence, fourth through sixth control signals associated with fourth through sixth sets of self-test operations that are to be executed on fourth through sixth test circuits, respectively, wherein a second auxiliary controller of the plurality of auxiliary controllers is configured to sequentially schedule the execution of the fourth through sixth sets of self-test operations;
provide the first and fourth control signals to the first and second auxiliary controllers to facilitate the execution of the first and fourth sets of self-test operations, respectively, wherein the primary controller provides the first and fourth control signals to the first and second auxiliary controllers, respectively, in one of a serial manner, a parallel manner, and a staggered manner;
provide the second and fifth control signals to the first and second auxiliary controllers to facilitate the execution of the second and fifth sets of self-test operations, respectively, when the first and fourth sets of self-test operations are executed, wherein the primary controller provides the second and fifth control signals to the first and second auxiliary controllers, respectively, in one of a serial manner, a parallel manner, and a staggered manner; and
provide the third and sixth control signals to the first and second auxiliary controllers to facilitate the execution of the third and sixth sets of self-test operations, respectively, when the second and fifth sets of self-test operations are executed, wherein the primary controller provides the third and sixth control signals to the first and second auxiliary controllers, respectively, in one of a serial manner, a parallel manner, and a staggered manner.

13. The control system of claim 1, wherein the primary controller is further coupled with a fault controller of the SoC, and further configured to generate a fault signal based on the first through third status bits, and provide the fault signal to the fault controller to facilitate a fault diagnosis of the SoC.

14. The control system of claim 1, wherein the primary controller and the first auxiliary controller are further coupled with a core circuit of the SoC, and further configured to receive first and second configuration data, respectively, and wherein the primary controller initiates the BIST sequence based on the first configuration data, and the first auxiliary controller schedules the execution of the first through third sets of self-test operations based on the second configuration data.

15. A system-on-chip (SoC), comprising:
first through third test circuits;
a set of functional built-in self-test (BIST) controllers, a set of memory BIST (MBIST) controllers, and a set of logic BIST (LBIST) controllers that are coupled with the first through third test circuits, and configured to execute first through third sets of self-test operations on the first through third test circuits, respectively; and
a control system configured to facilitate a BIST of the SoC, the control system comprising:
a primary controller configured to initiate a BIST sequence associated with the SoC; and
a plurality of auxiliary controllers coupled with the primary controller, wherein a first auxiliary controller of the plurality of auxiliary controllers is further coupled with the set of functional BIST controllers, the set of MBIST controllers, and the set of LBIST controllers, and wherein the first auxiliary controller is configured to:
sequentially schedule, based on the initiation of the BIST sequence, execution of the first through third sets of self-test operations by the set of functional BIST controllers, the set of MBIST controllers, and the set of LBIST controllers, respectively; and
provide, to the primary controller based on the execution of the first through third sets of self-test operations, first through third status bits that indicate whether at least one functional circuit of the first test circuit, at least one memory of the second test circuit, and at least one logic circuit of the third test circuit are faulty, respectively wherein:
the primary controller is further configured to generate, to initiate the BIST sequence, seventh and eighth control signals, and provide the seventh and eighth control signals to the first auxiliary controller before the execution of the second set of self-test operations is scheduled and after the third set of self-test operations is executed, respectively,
the first auxiliary controller is further configured to generate a set of isolation signals and a set of select signals such that the set of isolation signals and the set of select signals are activated when the seventh control signal is activated, and deactivated when the eighth control signal is activated,
the set of isolation signals and the set of select signals are activated to activate a self-test mode of the SoC, and deactivated to deactivate the self-test mode of the SoC, and
the execution of the second and third sets of self-test operations is scheduled during the self-test mode of the SoC.

16. The SoC of claim 15, further comprising a fault controller that is coupled with the primary controller, wherein the primary controller is further configured to generate a fault signal based on the first through third status bits, and provide the fault signal to the fault controller to facilitate a fault diagnosis of the SoC.

17. The SoC of claim 15, wherein to initiate the BIST sequence, the primary controller is further configured to generate first through third control signals associated with the first through third sets of self-test operations, respectively, wherein the primary controller is further configured to provide the first through third control signals to the first auxiliary controller, and wherein the first auxiliary controller schedules the execution of the first through third sets of self-test operations when the first through third control signals are activated, respectively.

18. The SoC of claim 17, wherein the first auxiliary controller is further configured to generate and provide, to the primary controller as responses to the first through third control signals, first through third acknowledgment signals such that the first through third acknowledgment signals are activated when the first through third sets of self-test operations are executed, respectively, and wherein the primary controller provides the second and third control signals to the first auxiliary controller based on the first and second acknowledgment signals, respectively.

19. A method for facilitating a built-in self-test (BIST) of a system-on-chip (SoC) by a control system of the SoC, the method comprising:
initiating, by a primary controller of the control system, a BIST sequence associated with the SoC, wherein the primary controller is further configured to generate, to initiate the BIST sequence, seventh and eighth control signals, and provide the seventh and eighth control signals to a first auxiliary controller before the execution of a second set of self-test operations is scheduled and after a third set of self-test operations is executed, respectively;
sequentially scheduling, by flail the first auxiliary controller of a plurality of auxiliary controllers of the control system based on the initiation of the BIST sequence, execution of the first, second, and the third set of self-test operations on first through third test circuits of the SoC by a set of functional BIST controllers, a set of memory BIST controllers, and a set of logic BIST controllers of the SoC, respectively; wherein the first auxiliary controller is further configured to generate a set of isolation signals and a set of select signals such that the set of isolation signals and the set of select signals are activated when the seventh control signal is activated, and deactivated when the eighth control signal is activated, the set of isolation signals and the set of select signals are activated to activate a self-test mode of the SoC, and deactivated to deactivate the self-test mode of the SoC, and the execution of the second and third sets of self-test operations is scheduled during the self-test mode of the SoC; and
providing, to the primary controller by the first auxiliary controller based on the execution of the first through third sets of self-test operations, first through third status bits that indicate whether at least one functional circuit of the first test circuit, at least one memory of the second test circuit, and at least one logic circuit of the third test circuit are faulty, respectively.

* * * * *